(12) United States Patent
Kiyotoshi

(10) Patent No.: US 8,581,330 B2
(45) Date of Patent: Nov. 12, 2013

(54) SEMICONDUCTOR MEMORY DEVICE AND METHOD FOR MANUFACTURING THE SAME

(75) Inventor: Masahiro Kiyotoshi, Mie-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 98 days.

(21) Appl. No.: 13/326,972

(22) Filed: Dec. 15, 2011

(65) Prior Publication Data

US 2013/0032873 A1 Feb. 7, 2013

(30) Foreign Application Priority Data

Aug. 4, 2011 (JP) ................................. 2011-171087

(51) Int. Cl.
*H01L 29/792* (2006.01)

(52) U.S. Cl.
USPC ........................................................ 257/324

(58) Field of Classification Search
USPC ........................................................ 257/324
See application file for complete search history.

(56) References Cited

U.S. PATENT DOCUMENTS

| | | | |
|---|---|---|---|
| 6,933,556 B2 * | 8/2005 | Endoh et al. | 257/315 |
| 7,902,591 B2 * | 3/2011 | Kito et al. | 257/324 |
| 8,148,789 B2 * | 4/2012 | Kito et al. | 257/410 |
| 8,247,863 B2 * | 8/2012 | Fukuzumi et al. | 257/324 |
| 8,330,208 B2 * | 12/2012 | Alsmeier et al. | 257/321 |
| 8,455,940 B2 * | 6/2013 | Lee et al. | 257/324 |
| 2002/0195668 A1 * | 12/2002 | Endoh et al. | 257/390 |
| 2008/0173933 A1 * | 7/2008 | Fukuzumi et al. | 257/324 |
| 2008/0277720 A1 * | 11/2008 | Youn et al. | 257/324 |
| 2008/0283898 A1 * | 11/2008 | Kuniya | 257/316 |
| 2009/0108333 A1 * | 4/2009 | Kito et al. | 257/324 |
| 2010/0172189 A1 * | 7/2010 | Itagaki et al. | 365/185.29 |
| 2010/0207195 A1 * | 8/2010 | Fukuzumi et al. | 257/326 |
| 2010/0213538 A1 * | 8/2010 | Fukuzumi et al. | 257/326 |
| 2011/0115014 A1 * | 5/2011 | Ichinose et al. | 257/324 |
| 2011/0156132 A1 | 6/2011 | Kiyotoshi | |
| 2011/0198684 A1 * | 8/2011 | Inoue | 257/324 |
| 2011/0216597 A1 * | 9/2011 | Higashi et al. | 365/185.18 |
| 2011/0284946 A1 * | 11/2011 | Kiyotoshi | 257/324 |
| 2011/0303971 A1 * | 12/2011 | Lee et al. | 257/324 |
| 2012/0001252 A1 * | 1/2012 | Alsmeier et al. | 257/321 |
| 2012/0008400 A1 * | 1/2012 | Fukuzumi et al. | 365/185.18 |
| 2012/0018796 A1 * | 1/2012 | Yahashi et al. | 257/324 |
| 2012/0098050 A1 * | 4/2012 | Shim et al. | 257/324 |
| 2012/0112264 A1 * | 5/2012 | Lee et al. | 257/324 |

(Continued)

FOREIGN PATENT DOCUMENTS

| | | |
|---|---|---|
| JP | 2009-111049 | 5/2009 |
| JP | 2009-146954 | 7/2009 |

*Primary Examiner* — Jae Lee
*Assistant Examiner* — Grant Withers
(74) *Attorney, Agent, or Firm* — Oblon, Spivak, McClelland, Maier & Neustadt, L.L.P.

(57) ABSTRACT

According to one embodiment, a semiconductor memory device includes a stacked body, a semiconductor pillar, and a plurality of memory cells. The stacked body includes a plurality of stacked gate electrodes and inter-electrode insulating layers provided between the gate electrodes. The semiconductor pillar punches through the stacked body. The plurality of memory cells is provided in stacking direction. The memory cell includes a charge trap layer provided between the semiconductor pillar and the gate electrode via an air gap. The block insulating layer is provided between the charge trap layer and the gate electrode. Each of the plurality of memory cells is provided with a support portion configured to keep air gap distance between the charge trap layer and the semiconductor pillar.

9 Claims, 13 Drawing Sheets

(56) References Cited

U.S. PATENT DOCUMENTS

| | | | |
|---|---|---|---|
| 2012/0135595 A1* | 5/2012 | Kito et al. | 438/591 |
| 2012/0241841 A1* | 9/2012 | Mizushima et al. | 257/324 |
| 2012/0241842 A1* | 9/2012 | Matsuda | 257/324 |
| 2012/0241843 A1* | 9/2012 | Iino et al. | 257/324 |
| 2012/0267699 A1* | 10/2012 | Kiyotoshi | 257/319 |
| 2012/0267702 A1* | 10/2012 | Jee et al. | 257/324 |
| 2012/0273870 A1* | 11/2012 | Liu | 257/324 |
| 2012/0292686 A1* | 11/2012 | Son et al. | 257/316 |
| 2012/0326223 A1* | 12/2012 | Omura | 257/324 |
| 2013/0032874 A1* | 2/2013 | Ko | 257/324 |
| 2013/0032875 A1* | 2/2013 | Yun et al. | 257/324 |
| 2013/0069140 A1* | 3/2013 | Ichinose et al. | 257/324 |
| 2013/0069141 A1* | 3/2013 | Pan et al. | 257/324 |
| 2013/0075807 A1* | 3/2013 | Shim et al. | 257/324 |
| 2013/0087845 A1* | 4/2013 | Yasuda | 257/324 |
| 2013/0099304 A1* | 4/2013 | Kim et al. | 257/324 |
| 2013/0161726 A1* | 6/2013 | Kim et al. | 257/324 |

* cited by examiner

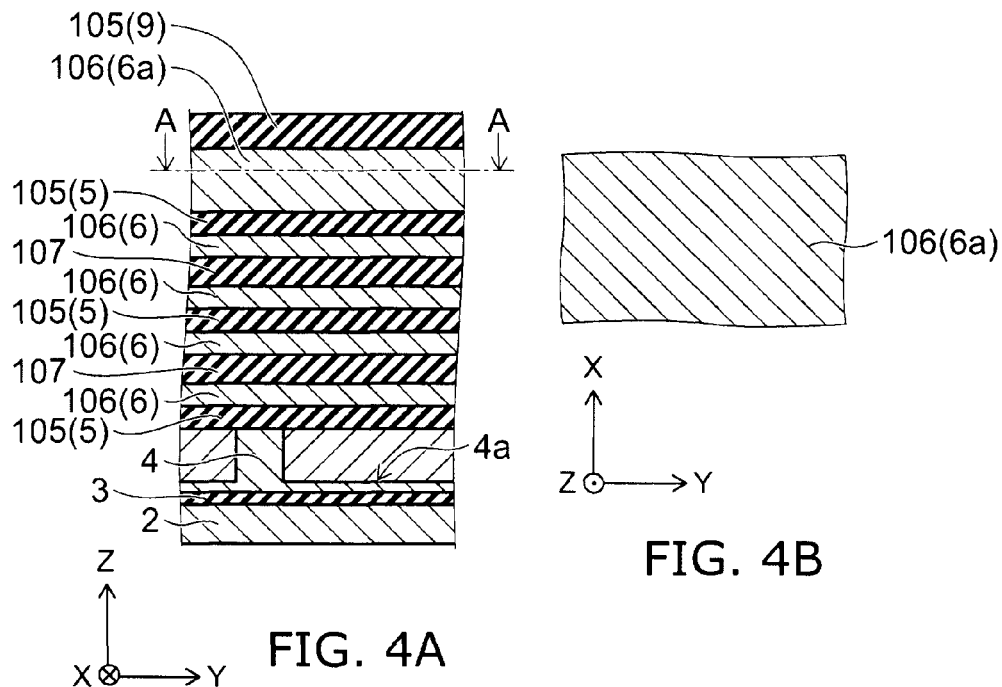
FIG. 4A
FIG. 4B
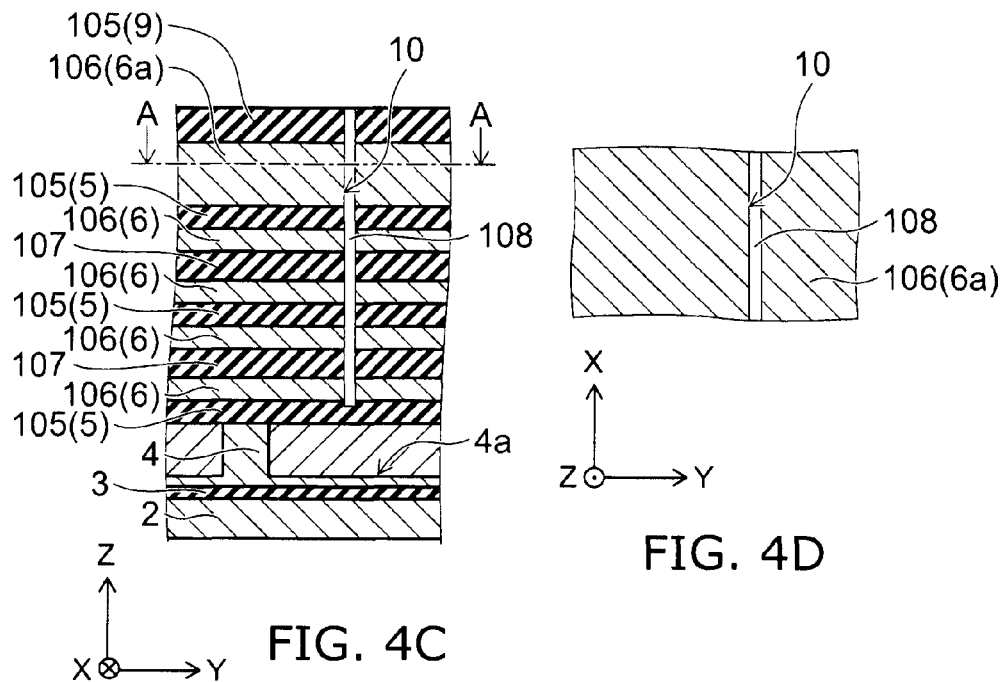
FIG. 4C
FIG. 4D

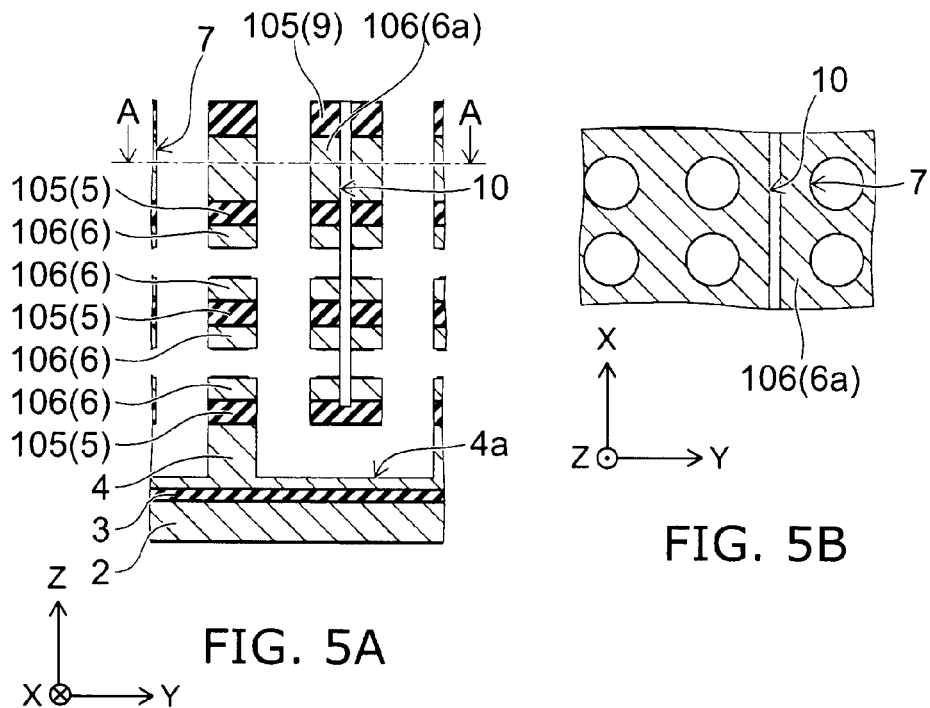
FIG. 5A
FIG. 5B
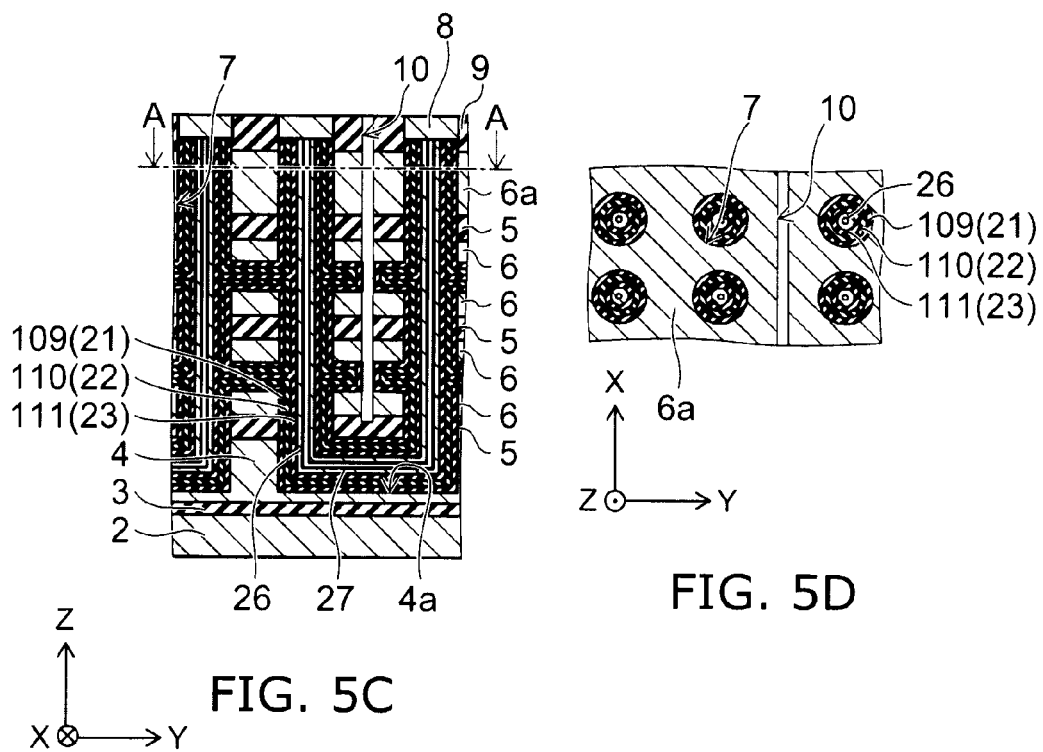
FIG. 5C
FIG. 5D

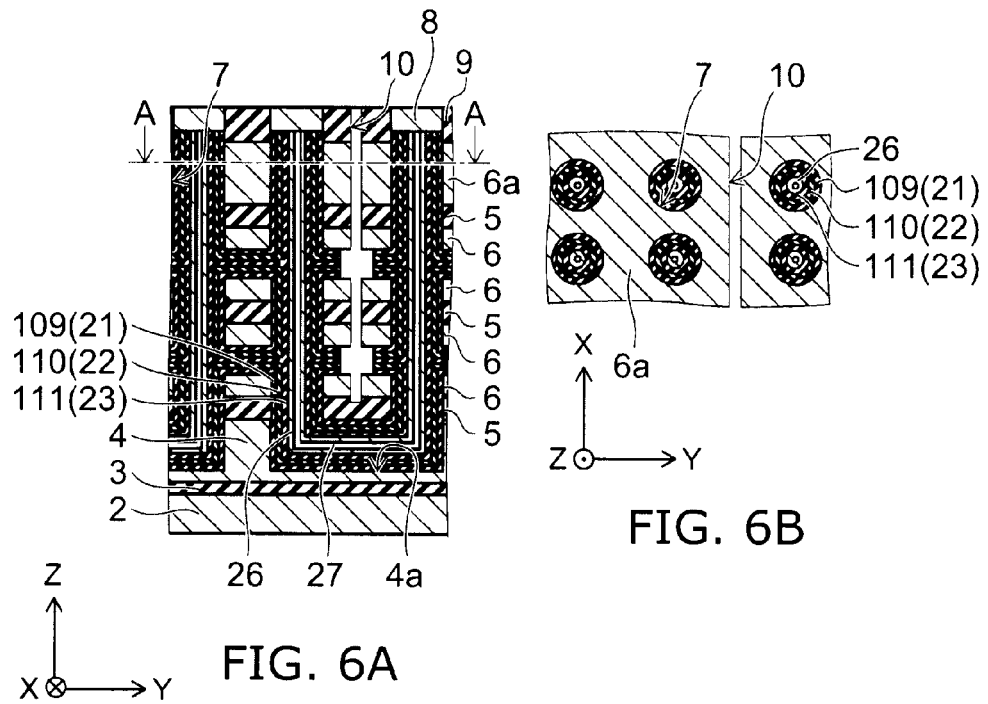
FIG. 6A
FIG. 6B
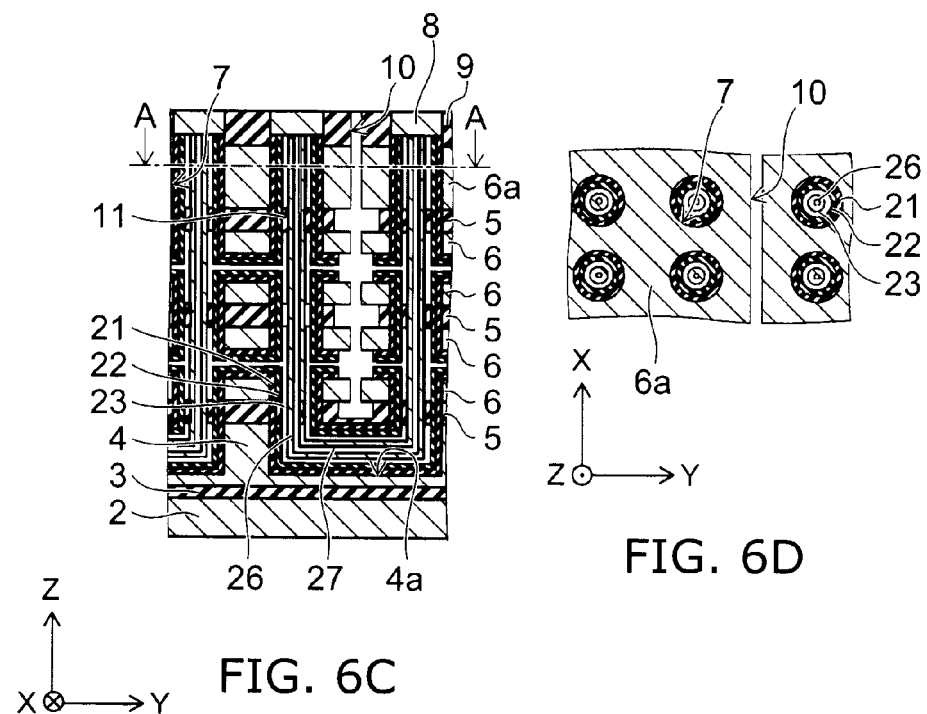
FIG. 6C
FIG. 6D

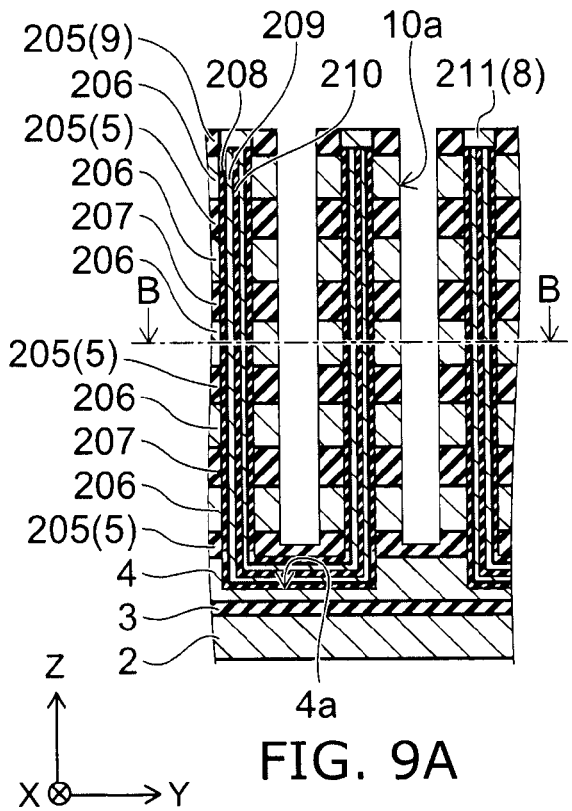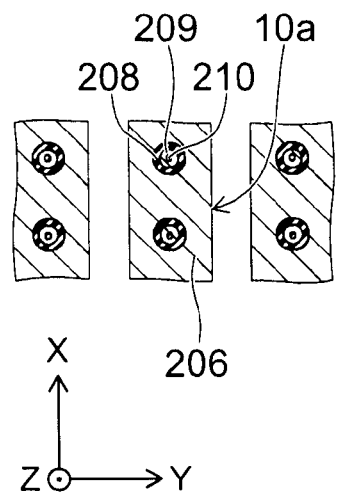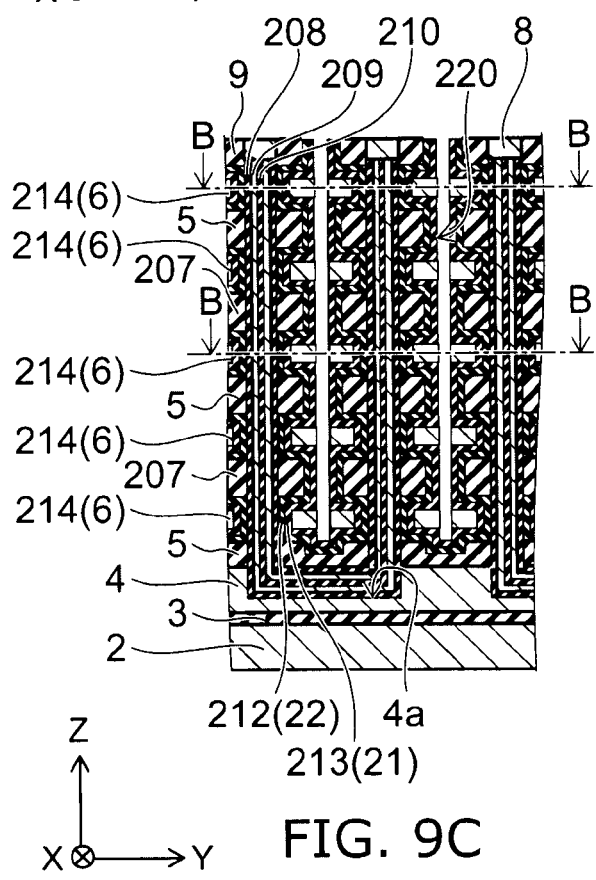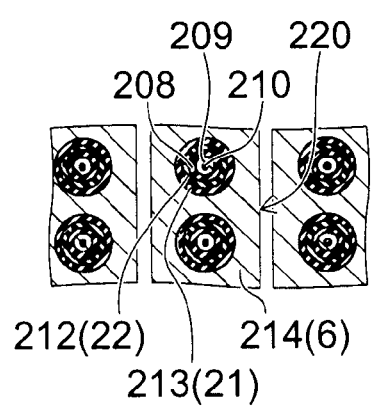
FIG. 9A
FIG. 9B
FIG. 9C
FIG. 9D

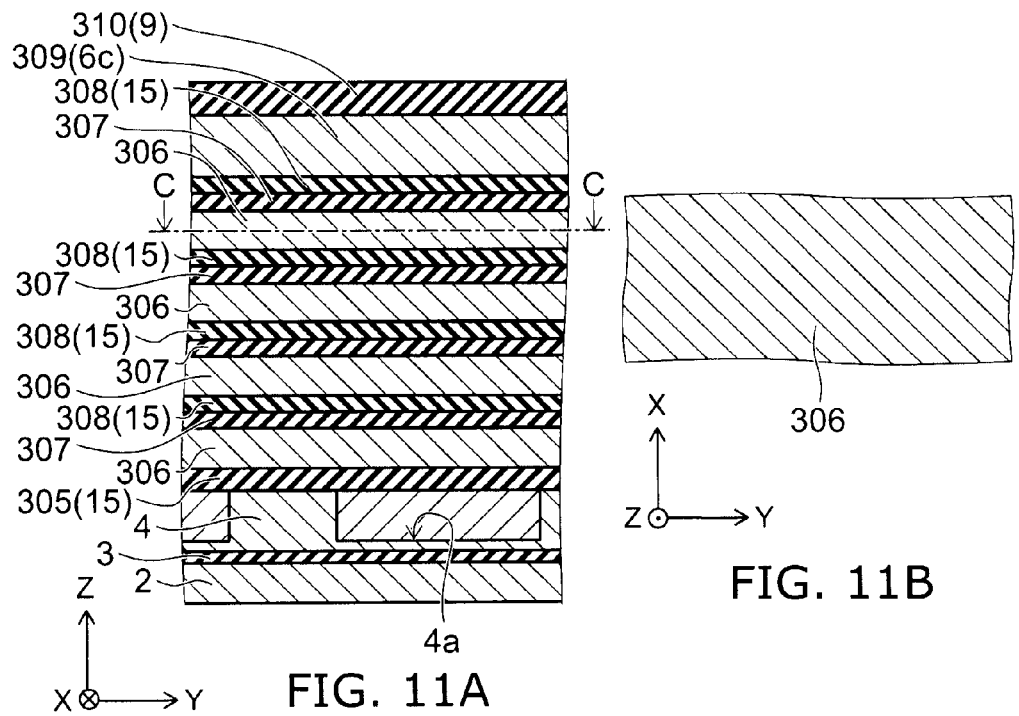
FIG. 11A
FIG. 11B
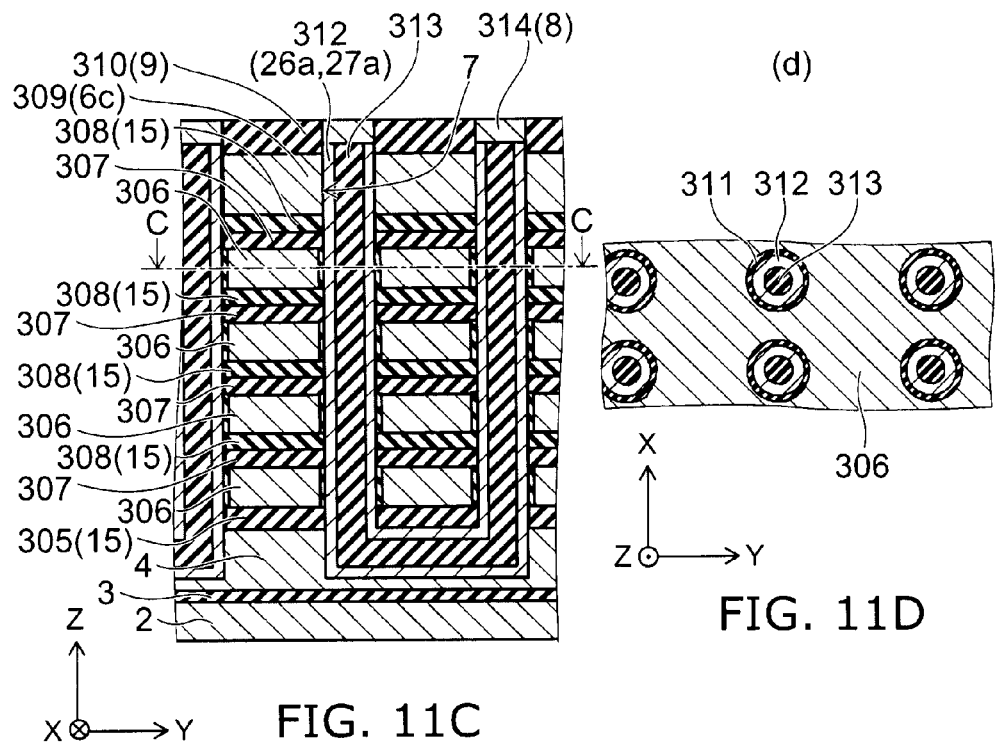
FIG. 11C
FIG. 11D

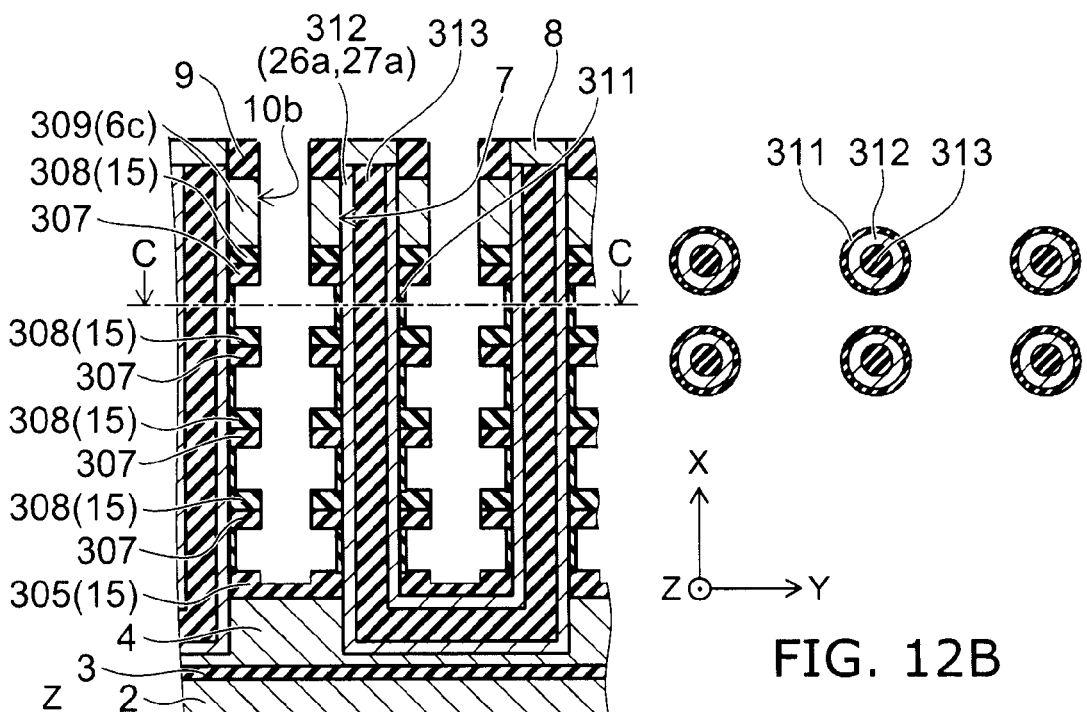
FIG. 12A
FIG. 12B
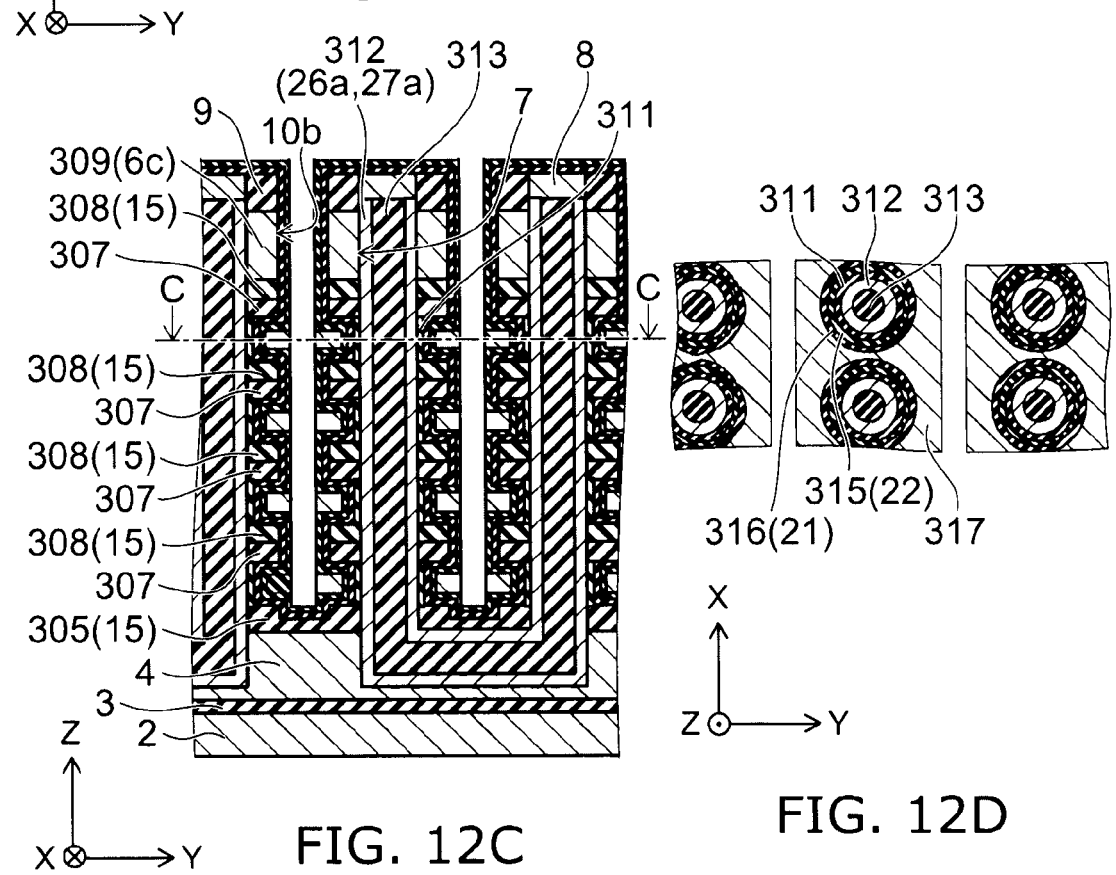
FIG. 12C
FIG. 12D

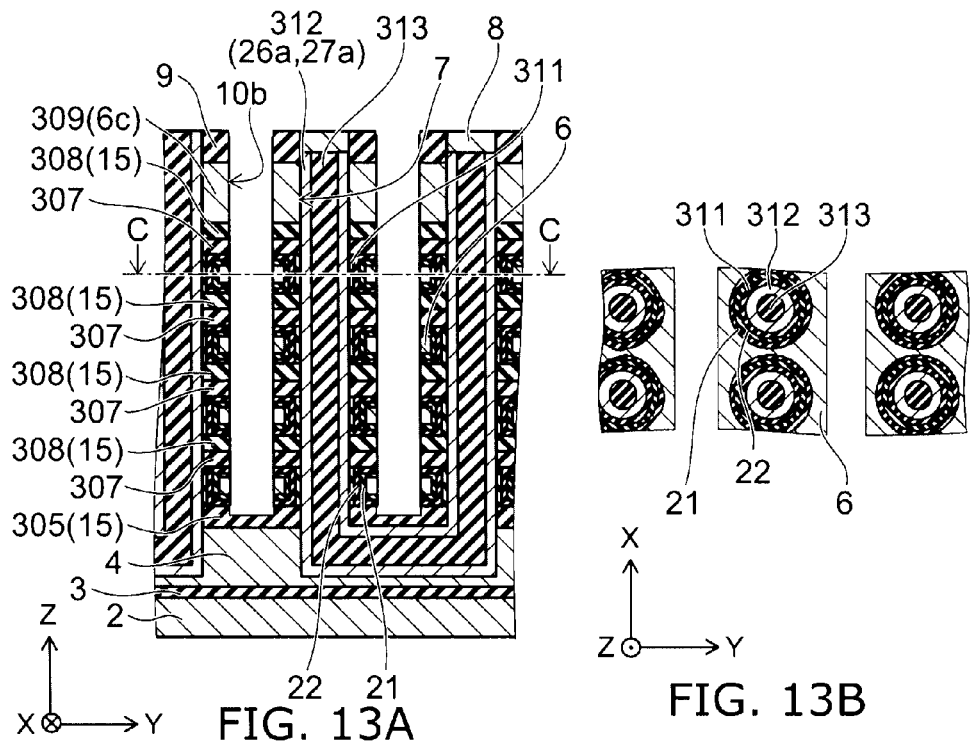
FIG. 13A
FIG. 13B
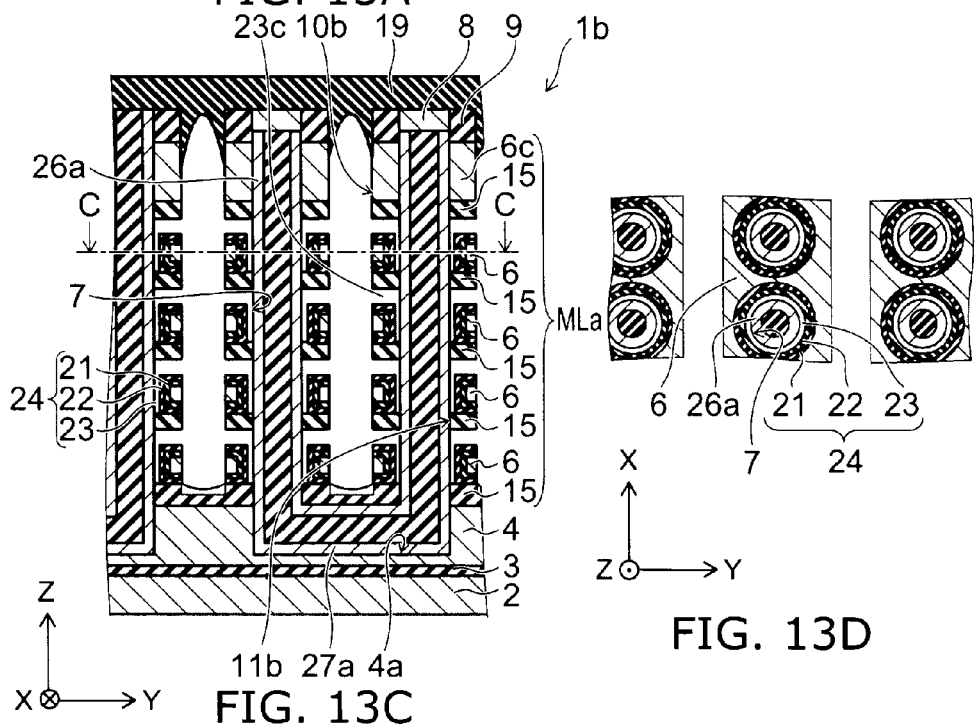
FIG. 13C
FIG. 13D

SEMICONDUCTOR MEMORY DEVICE AND METHOD FOR MANUFACTURING THE SAME

CROSS-REFERENCE TO RELATED APPLICATIONS

This application is based upon and claims the benefit of priority from the prior Japanese Patent Application No. 2011-171087, filed on Aug. 4, 2011; the entire contents of which are incorporated herein by reference.

FIELD

Embodiments described herein relate generally to a semiconductor memory device and method for manufacturing the same.

BACKGROUND

In the field of semiconductor memory devices, attention has been focused on the three-dimensional stacked memory. Relatively free from the limitation of resolution in lithography technology, the three-dimensional stacked memory can increase the bit density. In an example of such a three-dimensional stacked memory, MONOS memory strings are arranged in a two-dimensional matrix configuration. The MONOS memory string includes a columnar semiconductor pillar. The MONOS memory string further includes a tunnel insulating layer, a charge trap layer, and a block insulating layer stacked so as to cover the side surface of the semiconductor pillar. The MONOS memory string further includes a plurality of plate-shaped electrodes crossing the semiconductor pillar and provided in the stacking direction with a prescribed spacing. In such a three-dimensional stacked memory, the plate-shaped electrode is shared by the memory strings adjacent in a prescribed direction.

In this structure, to increase the bit density, it is necessary to increase the number of stacked layers, or to increase the density of semiconductor pillars. In the latter approach, thinning of the tunnel insulating layer, the charge trap layer, and the block insulating layer constituting the MONOS cell is important.

However, if the tunnel insulating layer is simply thinned in the MONOS memory, then although writing by the tunnel current becomes easy, data retention will become degraded. Thus, a technique of implementing the tunnel insulating layer as an air gap is proposed.

However, in the three-dimensional stacked memory, if the tunnel insulating layer is simply implemented as an air gap, the semiconductor pillar may undergo deformation such as warpage. As a result, the charge trap layer and the semiconductor pillar may be brought into contact with each other. This may decrease the reliability for e.g. writing characteristics.

BRIEF DESCRIPTION OF THE DRAWINGS

FIGS. 4A to 4D are schematic process sectional views illustrating the method for manufacturing a semiconductor memory device according to the fourth embodiment.

FIGS. 5A to 5D are schematic process sectional views subsequent to FIGS. 4A to 4D.

FIGS. 6A to 6D are schematic process sectional views subsequent to FIGS. 5A to 5D.

FIGS. 9A to 9D are schematic process sectional views subsequent to FIGS. 8A to 8D.

FIGS. 11A to 11D are schematic process sectional views illustrating the method for manufacturing a semiconductor memory device according to the sixth embodiment.

FIGS. 12A to 12D are schematic process sectional views subsequent to FIGS. 11A to 11D.

FIGS. 13A to 13D are schematic process sectional views subsequent to FIGS. 12A to 12D.

DETAILED DESCRIPTION

Figure 1A:
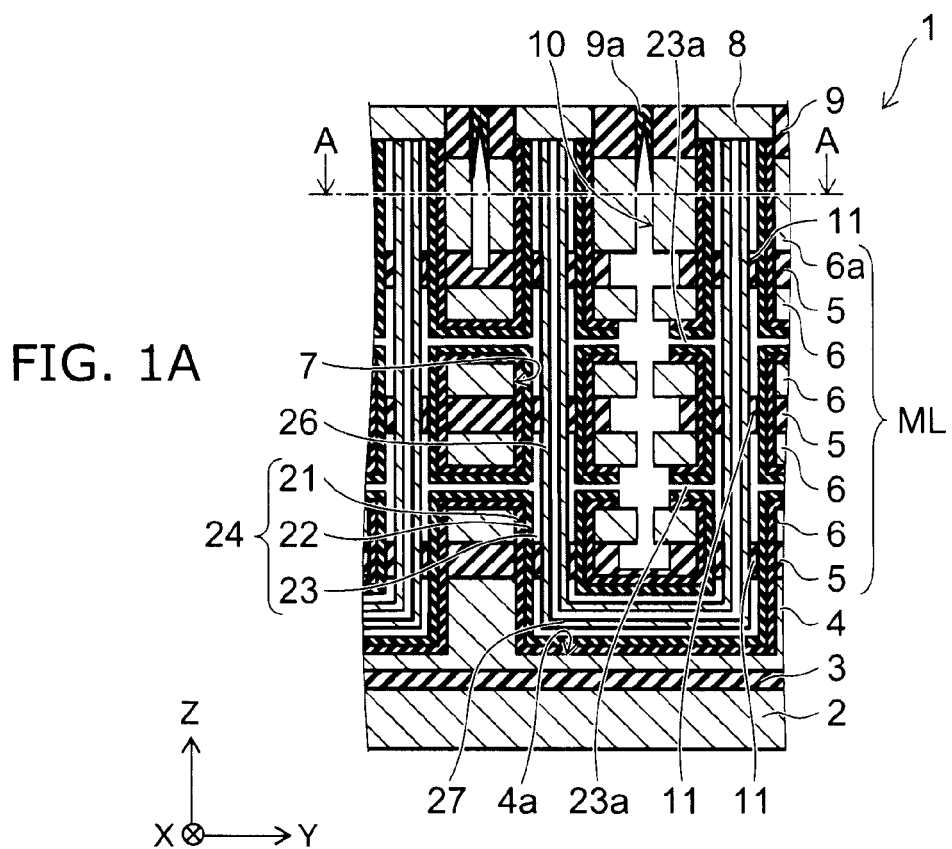
FIGS. 1A and 1B are schematic sectional views illustrating a semiconductor memory device according to a first embodiment.

In general, according to one embodiment, a semiconductor memory device includes a stacked body, a semiconductor pillar, and a plurality of memory cells. The stacked body includes a plurality of stacked gate electrodes and inter-electrode insulating layers provided between the gate electrodes. The semiconductor pillar punches through the stacked body. The plurality of memory cells is provided in stacking direction. The memory cell includes a charge trap layer provided between the semiconductor pillar and the gate electrode via an air gap. The block insulating layer is provided between the charge trap layer and the gate electrode. Each of the plurality of memory cells is provided with a support portion configured to keep air gap distance between the charge trap layer and the semiconductor pillar.

Embodiments will now be illustrated with reference to the drawings. In the drawings, similar components are labeled with like reference numerals, and the detailed description thereof is omitted appropriately.

First Embodiment

The semiconductor memory device 1 includes a memory region with memory cells for storing data, and a peripheral circuit region with peripheral circuits for driving the memory cells in the memory region. In this case, the peripheral circuit region can be based on known techniques. Hence, illustration of the peripheral circuit region is omitted, and the memory region is illustrated herein.

Figure 1B:
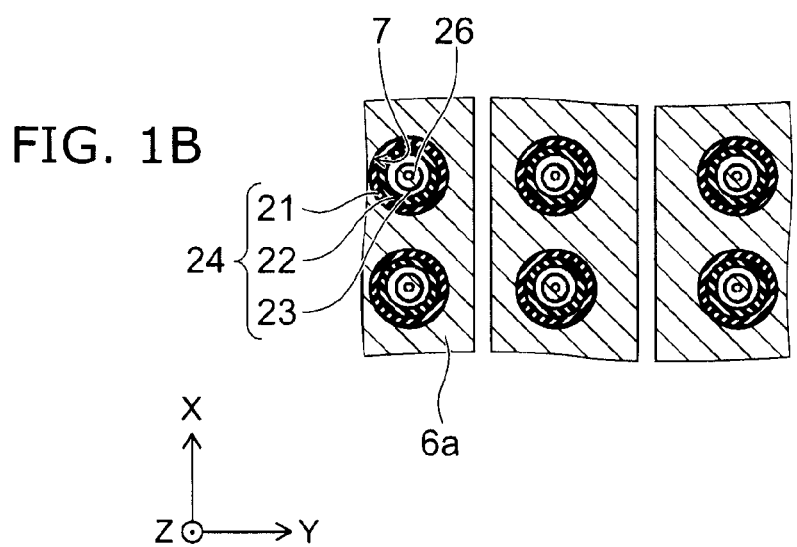

FIGS. 1A and 1B are schematic sectional views illustrating a semiconductor memory device according to a first embodiment. More specifically, FIG. 1A is a schematic sectional view illustrating the memory string portion. FIG. 1B is a sectional view taken in the direction of arrows A-A in FIG. 1A.

The X direction, Y direction, and Z direction in FIG. 1A represent mutually orthogonal directions. The X direction and the Y direction are taken parallel to the major surface of the substrate 2. The Z direction is taken in the stacking direction, orthogonal to the major surface of the substrate 2.

As shown in FIG. 1A, the memory region of the semiconductor memory device 1 includes a substrate 2. The substrate 2 can be formed from e.g. single crystal silicon.

On the substrate 2, an insulating layer 3, a back gate electrode 4, and a stacked body ML are provided. The insulating layer 3 can be formed from e.g. silicon oxide. The back gate electrode 4 can be formed from e.g. boron-doped polycrystalline silicon. The stacked body ML can be configured to include a plurality of stacked gate electrodes 6, and inter-electrode insulating layers 5 provided between the gate electrodes 6. The inter-electrode insulating layer 5 can be formed from e.g. silicon oxide. The gate electrode 6 can be formed from e.g. boron-doped amorphous silicon. In the example illustrated in FIG. 1A, the gate electrodes 6 are stacked in five layers, with the uppermost layer constituting a select gate electrode 6a. However, the number of stacked layers is not limited thereto. For instance, the gate electrodes 6 can also be stacked in ten or more layers.

A plurality of through holes 7 punches through the stacked body ML in the stacking direction (Z direction). As shown in FIG. 1B, as viewed in the Z direction, the through holes 7 are arranged in a matrix configuration along the X and Y directions. Two through holes 7 adjacent in the Y direction are brought into connection with each other by a recess 4a formed in the back gate electrode 4.

On the inner surface of the through hole 7 and the recess 4a, a block insulating layer 21 is provided. The block insulating layer 21 is a layer which does not substantially pass a current even under application of voltage within the driving voltage range of the semiconductor memory device 1. The block insulating layer 21 can be formed from e.g. silicon oxide.

A charge trap layer 22 is provided inside the block insulating layer 21. The charge trap layer 22 is a layer capable of storing charge. For instance, the charge trap layer 22 can be a layer including electron trap sites. The charge trap layer 22 can be formed from e.g. silicon nitride.

A void 23 (air gap) functioning as a tunnel insulating layer is provided inside the charge trap layer 22. The void 23 is normally insulative, but passes a tunnel current upon application of a prescribed voltage within the driving voltage range of the semiconductor memory device 1. Providing a void functioning as a tunnel insulating layer can facilitate concentrating the electric field. Hence, the writing characteristics and erasure characteristics, in particular the erasure characteristics, can be improved.

In this configuration, the block insulating layer 21 and the charge trap layer 22 are embedded in the through hole 7. Hence, the dimension in the X and Y directions (the diameter dimension in the cross section) of the semiconductor pillar 26 (channel semiconductor) can be reduced. This enables memory cell arrangement with higher bit density. Furthermore, the curvature radius of the void 23 functioning as a tunnel insulating layer can be reduced to enhance electric field concentration. Thus, a memory cell 24 with superior writing characteristics and erasing characteristics can be attained.

A semiconductor pillar 26 and a connecting beam 27 are provided inside the void 23.

More specifically, punching through the stacked body ML, a semiconductor pillar 26, a charge trap layer 22 provided between the semiconductor pillar 26 and the gate electrode 6 via the void 23, and a block insulating layer 21 provided between the charge trap layer 22 and the gate electrode 6 are provided.

The semiconductor pillar 26 exhibits a hollow columnar (cylindrical) shape extending in the Z direction in the through hole 7. For instance, the semiconductor pillar 26 can be shape like a circular cylinder.

The connecting beam 27 exhibits a hollow columnar shape extending in the Y direction in the recess 4a. For instance, the connecting beam 27 can be shape like a cylinder.

Two semiconductor pillars 26 adjacent in the Y direction are connected to each other by the connecting beam 27.

The semiconductor pillar 26 and the connecting beam 27 can be formed from e.g. polysilicon.

In the upper end portion of the semiconductor pillar 26 is provided a source/drain region portion 8 ion-implanted with arsenic.

One of the two semiconductor pillars 26 connected to each other by the connecting beam 27 is connected to a source line, not shown, via the source/drain region portion 8. The other semiconductor pillar 26 is connected to a bit line, not shown, via the source/drain region portion 8. By such configuration, the charge trap layer 22 is located between the gate electrode 6 and the semiconductor pillar 26. Thus, a memory cell 24 is configured at each intersection of the gate electrode 6 and the semiconductor pillar 26. That is, a plurality of memory cells 24 is configured in the stacking direction.

Furthermore, an insulating film 9 is provided on the select gate electrode 6a. The insulating film 9 can be formed from e.g. silicon oxide.

Between the two semiconductor pillars 26 connected to each other by the connecting beam 27 is provided an isolation trench 10 for isolating the gate electrodes 6 in the Y direction. The inside of the isolation trench 10 is not filled, but left as a void (air gap). That is, a void (an unfilled isolation trench 10) is formed between the adjacent gate electrodes 6 of the plurality of stacked memory cells 24. By leaving the inside of the isolation trench 10 unfilled, electrical interference between the memory cells 24 adjacent in the Y direction can be suppressed.

The upper end opening of the isolation trench 10 is closed with an insulating film 9a. The insulating film 9a can be formed from e.g. silicon oxide.

Also between the gate electrodes 6 in the Z direction is provided a void 23a (air gap). One end portion of the void 23a is in connection with the isolation trench 10. The other end portion is in connection with the void 23. By providing a void 23a, electrical interference between the memory cells 24 adjacent in the Z direction can be suppressed. Furthermore, the capacitance between the memory cells 24 adjacent in the Z direction can be reduced. Hence, the dimension in the Z direction of the memory cell 24, and hence the thickness dimension of the memory region, can be reduced.

Above the insulating film 9, although not shown, source lines, bit lines, vias, contacts, extraction wirings, upper wirings and the like are provided. These can be based on known techniques, and hence the detailed description thereof is omitted.

Here, if a void 23 is simply provided between the charge trap layer 22 and the semiconductor pillar 26, the charge trap layer 22 and the semiconductor pillar 26 may be brought into contact with each other. This may decrease the reliability for e.g. writing characteristics.

For instance, in the structure in which two semiconductor pillars 26 are connected to each other by a connecting beam 27 (hereinafter referred to as U-shaped channel structure), if the tunnel insulating film is simply replaced by a void 23, the U-shaped channel is held only in the upper portion. Thus, by the Coulomb force due to charge accumulated during manufacturing, for instance, the U-shaped channel easily moves.

This makes it difficult to keep the width dimension of the void 23 (air gap width) constant. If the width dimension of the void is varied, or if the charge trap layer 22 and the semiconductor pillar 26 are brought into contact with each other, the writing/erasing characteristics are varied, and the reliability is decreased. Furthermore, this may limit the further scaling.

Thus, in this embodiment, a support portion 11 is provided at a prescribed position of the void 23 to keep the width dimension of the void 23 constant.

In this case, as shown in FIG. 1A, a support portion 11 for keeping the distance between the charge trap layer 22 and the semiconductor pillar 26 can be provided at each position between the charge trap layer 22 and the semiconductor pillar 26 where the inter-electrode insulating layer 5 is provided in the stacking direction. That is, for each of the stacked memory cells 24, a support portion 11 for keeping the distance between the charge trap layer 22 and the semiconductor pillar 26 can be provided.

Thus, in the stacked configuration of a plurality of inter-electrode insulating layers 5 and gate electrodes 6, support portions 11 can be arranged with a prescribed spacing. Then, even in the U-shaped channel structure, the width dimension of the void 23 can be easily kept constant. In this case, the arrangement pitch of the support portions 11 can also be provided with a prescribed periodicity.

The support portion 11 can be formed from e.g. silicon oxide.

Second Embodiment

Also in this embodiment, illustration of the peripheral circuit region is omitted, and the memory region is illustrated.

Figure 2A:
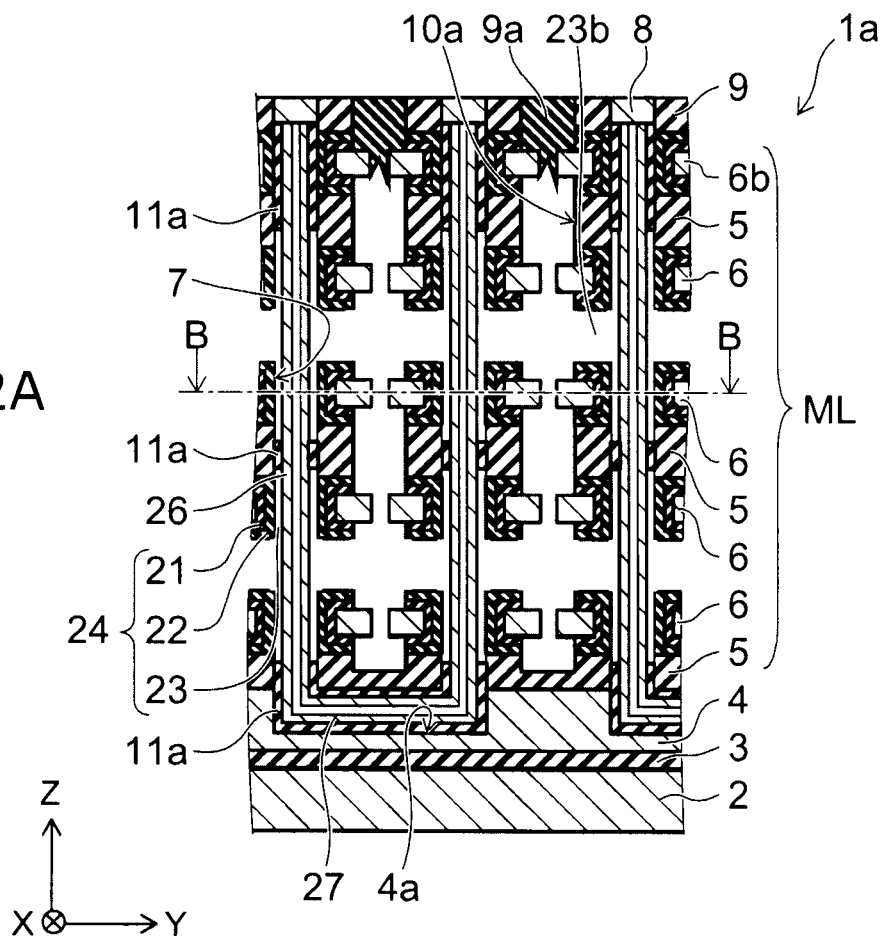
FIGS. 2A and 2B are schematic sectional views illustrating a semiconductor memory device according to a second embodiment.
Figure 2B:
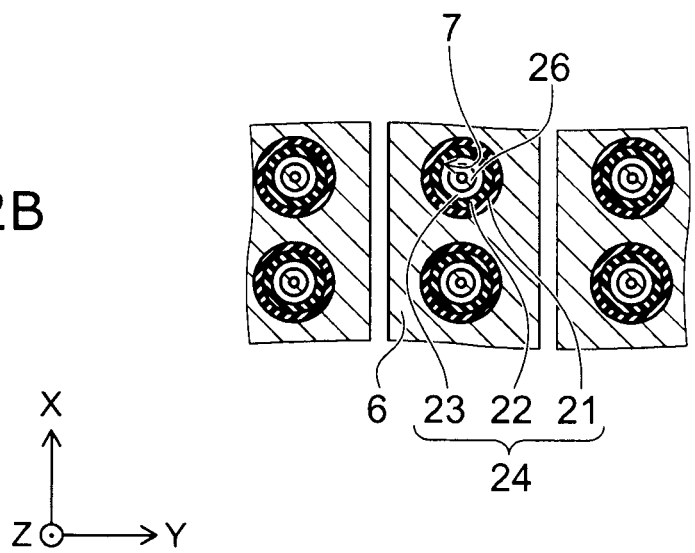

FIGS. 2A and 2B are schematic sectional views illustrating a semiconductor memory device according to a second embodiment. More specifically, FIG. 2A is a schematic sectional view illustrating the memory string portion. FIG. 2B is a sectional view taken in the direction of arrows B-B in FIG. 2A.

The X direction, Y direction, and Z direction in FIG. 2A represent mutually orthogonal directions. The X direction and the Y direction are taken parallel to the major surface of the substrate 2. The Z direction is taken in the stacking direction, orthogonal to the major surface of the substrate 2.

As shown in FIG. 2A, the memory region of the semiconductor memory device 1a includes a substrate 2. Similarly to the semiconductor memory device 1 described above, an insulating layer 3, a back gate electrode 4, and a stacked body ML are provided. The stacked body ML can be configured from interelectrode insulating layers 5 and gate electrodes 6 stacked therein. In the example illustrated in FIG. 2A, the gate electrodes 6 are stacked in five layers, with the uppermost layer constituting a select gate electrode 6b. However, the number of stacked layers is not limited thereto. For instance, the gate electrodes 6 can also be stacked in ten or more layers.

A plurality of through holes 7 punches through the stacked body ML in the stacking direction (Z direction). Two through holes 7 adjacent in the Y direction are brought into connection with each other by a recess 4a formed in the back gate electrode 4.

On the inner surface of the through hole 7 and the recess 4a, a block insulating layer 21 and a charge trap layer 22 are stacked.

Also in this embodiment, a void 23 (air gap) functioning as a tunnel insulating layer is provided inside the charge trap layer 22.

Furthermore, a semiconductor pillar 26 and a connecting beam 27 are provided inside the void 23.

More specifically, punching through the stacked body ML, a semiconductor pillar 26, a charge trap layer 22 provided between the semiconductor pillar 26 and the gate electrode 6 via the void 23, and a block insulating layer 21 provided between the charge trap layer 22 and the gate electrode 6 are provided.

In the upper end portion of the semiconductor pillar 26 is provided a source/drain region portion 8 ion-implanted with arsenic.

An insulating film 9 is provided on the select gate electrode 6b.

Between the semiconductor pillars 26 is provided an isolation trench 10a for isolating the gate electrodes 6 in the Y direction. The inside of the isolation trench 10a is not filled, but left as a void (air gap). That is, a void (an unfilled isolation trench 10a) is formed between the adjacent gate electrodes 6 of the plurality of stacked memory cells 24. By leaving the inside of the isolation trench 10a unfilled, electrical interference between the memory cells 24 adjacent in the Y direction can be suppressed.

The upper end opening of the isolation trench 10a is closed with an insulating film 9a.

Also between the gate electrodes 6 in the Z direction is provided a void 23b (air gap). One end portion of the void 23b is in connection with the isolation trench 10a. The other end portion is in connection with the void 23.

The void 23, the void 23b, and the isolation trench 10a left as a void according to this embodiment achieve operations and effects similar to those of the void 23, the void 23a, and the isolation trench 10 left as a void described above.

Above the insulating film 9, although not shown, source lines, bit lines, vias, contacts, extraction wirings, upper wirings and the like are provided. These can be based on known techniques, and hence the detailed description thereof is omitted.

Also in this embodiment, a support portion 11a is provided at a prescribed position of the void 23 to keep the width dimension of the void 23 constant.

In this case, as shown in FIG. 2A, a support portion 11a for keeping the distance between the charge trap layer 22 and the semiconductor pillar 26 can be provided at each position between the charge trap layer 22 and the semiconductor pillar 26 where the inter-electrode insulating layer 5 is provided in the stacking direction. That is, for each of the stacked memory cells 24, a support portion 11a for keeping the distance between the charge trap layer 22 and the semiconductor pillar 26 can be provided.

Furthermore, a support portion 11a can be further provided at the upper end or lower end of the semiconductor pillar 26.

Thus, in the stacked configuration of a plurality of inter-electrode insulating layers 5 and gate electrodes 6, support portions 11a can be arranged with a prescribed spacing. Then, even in the U-shaped channel structure, the width dimension of the void 23 can be easily kept constant. In this case, the arrangement pitch of the support portions 11a can also be provided with a prescribed periodicity.

The support portion 11a can be formed from e.g. silicon oxide.

Third Embodiment

Also in this embodiment, illustration of the peripheral circuit region is omitted, and the memory region is illustrated.

Figure 3A:
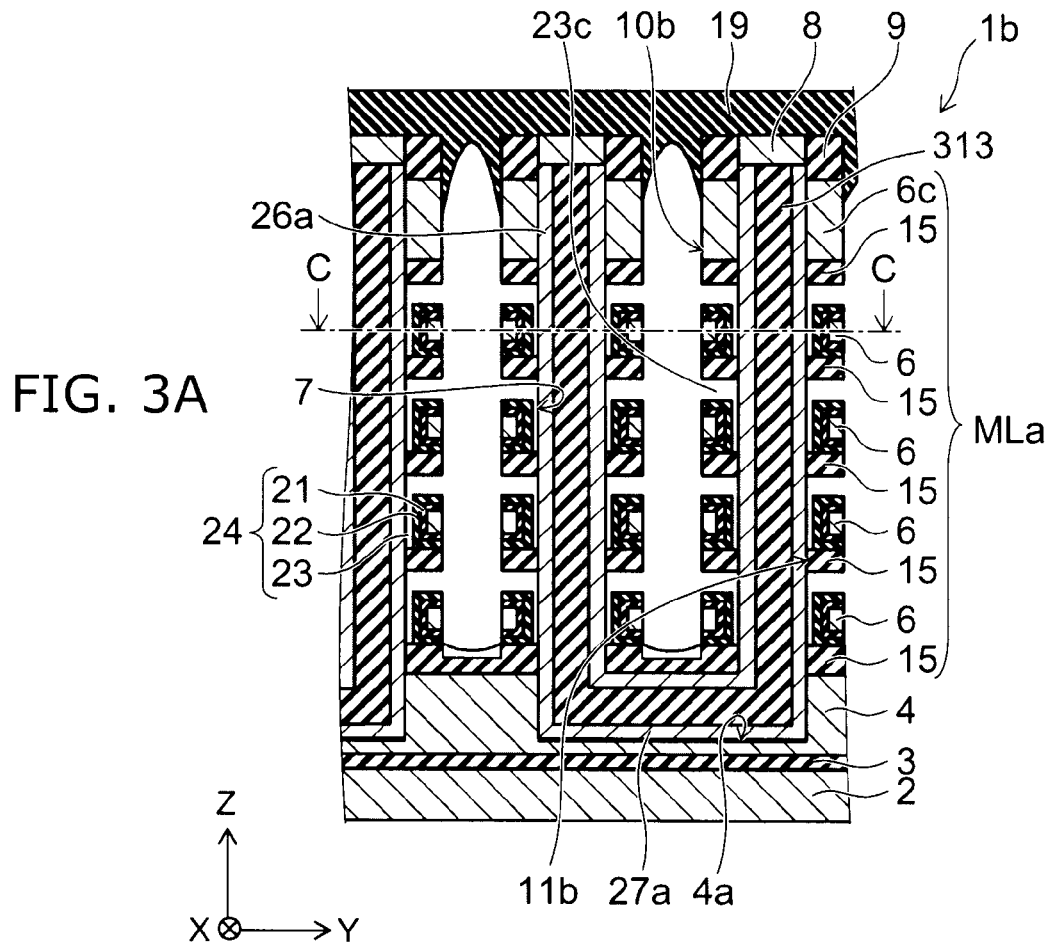
FIGS. 3A and 3B are schematic sectional views illustrating a semiconductor memory device according to a third embodiment.
Figure 3B:
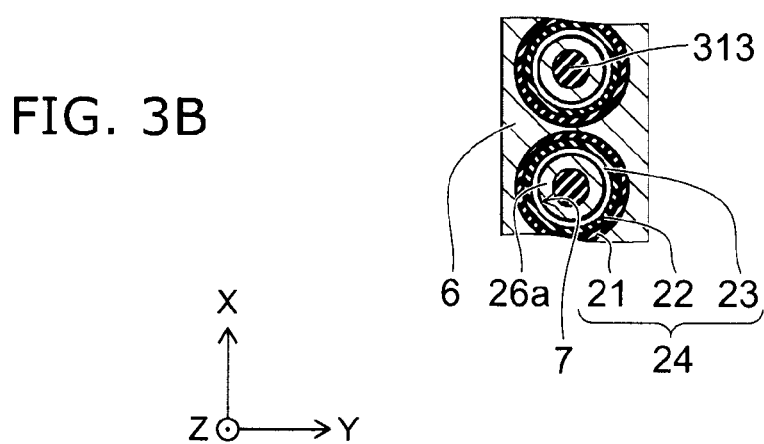

FIGS. 3A and 3B are schematic sectional views illustrating a semiconductor memory device according to a third embodiment. More specifically, FIG. 3A is a schematic sectional view illustrating the memory string portion. FIG. 3B is a sectional view taken in the direction of arrows C-C in FIG. 3A.

The X direction, Y direction, and Z direction in FIG. 3A represent mutually orthogonal directions. The X direction and the Y direction are taken parallel to the major surface of the substrate 2. The Z direction is taken in the stacking direction, orthogonal to the major surface of the substrate 2.

As shown in FIG. 3A, the memory region of the semiconductor memory device 1b includes a substrate 2. Similarly to the semiconductor memory device 1 described above, an insulating layer 3, a back gate electrode 4, and a stacked body MLa are provided. The stacked body MLa can be configured from interelectrode insulating layers 15 and gate electrodes 6 stacked therein. In the example illustrated in FIG. 3A, the gate electrodes 6 are stacked in five layers, with the uppermost layer constituting a select gate electrode 6c. However, the number of stacked layers is not limited thereto. For instance, the gate electrodes 6 can also be stacked in ten or more layers.

A plurality of through holes 7 punches through the stacked body MLa in the stacking direction (Z direction). Two through holes 7 adjacent in the Y direction are brought into connection with each other by a recess 4a formed in the back gate electrode 4.

On the inner surface of the through hole 7 and the recess 4a, a semiconductor pillar 26a and a connecting beam 27a are provided. Inside the semiconductor pillar 26a and the connecting beam 27a, a silicon oxide film 313 is embedded.

Between the semiconductor pillar 26a and the gate electrode 6, a block insulating layer 21 and a charge trap layer 22 are stacked.

Also in this embodiment, a void 23 (air gap) functioning as a tunnel insulating layer is provided inside the charge trap layer 22.

More specifically, punching through the stacked body MLa, a semiconductor pillar 26a, a charge trap layer 22 provided between the semiconductor pillar 26a and the gate electrode 6 via the void 23, and a block insulating layer 21 provided between the charge trap layer 22 and the gate electrode 6 are provided.

In the upper end portion of the semiconductor pillar 26a is provided a source/drain region portion 8 ion-implanted with arsenic.

An insulating film 9 is provided on the select gate electrode 6c.

Between the semiconductor pillars 26a is provided an isolation trench 10b for isolating the gate electrodes 6 in the Y direction. The inside of the isolation trench 10b is not filled, but left as a void (air gap). That is, a void (an unfilled isolation trench 10b) is formed between the adjacent gate electrodes 6 of the plurality of stacked memory cells 24. By leaving the inside of the isolation trench 10b unfilled, electrical interference between the memory cells 24 adjacent in the Y direction can be suppressed.

The upper end opening of the isolation trench 10b is closed with an insulating film 19. The insulating film 19 can be formed from e.g. silicon oxide.

Also between the gate electrodes 6 in the Z direction is provided a void 23c (air gap). One end portion of the void 23c is in connection with the isolation trench 10b. The other end portion is in connection with the void 23.

The void 23, the void 23c, and the isolation trench 10b left as a void according to this embodiment achieve operations and effects similar to those of the void 23, the void 23a, and the isolation trench 10 left as a void described above.

Above the insulating film 19, although not shown, source lines, bit lines, vias, contacts, extraction wirings, upper wirings and the like are provided. These can be based on known techniques, and hence the detailed description thereof is omitted.

Also in this embodiment, a support portion 11b is provided at a prescribed position of the void 23 to keep the width dimension of the void 23 constant.

However, in this embodiment, one end in the Y direction of the inter-electrode insulating layer 15 is connected to the semiconductor pillar 26a to keep the width dimension of the void 23 constant. That is, the inter-electrode insulating layer 15 and the support portion 11b are integrally provided so that the inter-electrode insulating layer 15 functions also as a support portion 11b. Alternatively, a support portion 11b can be separately provided on one end in the Y direction of the inter-electrode insulating layer 15.

In this case, as shown in FIG. 3A, a support portion 11b for keeping the distance between the charge trap layer 22 and the semiconductor pillar 26a is provided at each position between the charge trap layer 22 and the semiconductor pillar 26a where the inter-electrode insulating layer 15 is provided in the stacking direction. That is, for each of the stacked memory cells 24, a support portion 11b for keeping the distance between the charge trap layer 22 and the semiconductor pillar 26a is provided.

Thus, in the stacked configuration of a plurality of inter-electrode insulating layers 15 and gate electrodes 6, support portions 11b are arranged with a prescribed spacing. Hence, even in the U-shaped channel structure, the width dimension of the void 23 can be easily kept constant. In this case, the arrangement pitch of the support portions 11b is provided with a prescribed periodicity.

The inter-electrode insulating layer 15, also serving as a support portion 11b, can be formed from e.g. silicon oxide.

Fourth Embodiment

Next, a method for manufacturing a semiconductor memory device according to a fourth embodiment is illustrated.

The method for manufacturing a semiconductor memory device illustrated below illustrates a method for manufacturing the semiconductor memory device 1 described above.

In the method for manufacturing a semiconductor memory device according to this embodiment illustrated below, silicon oxide films 105 constituting inter-electrode insulating layers 5, boron-doped amorphous silicon films 106 constituting gate electrodes 6, and silicon nitride films 107 (corresponding to an example of the first sacrificial films) for forming a void 23 are stacked and collectively processed.

FIGS. 4A to 4D are schematic process sectional views illustrating the method for manufacturing a semiconductor memory device according to the fourth embodiment. More specifically, FIG. 4A is a schematic process sectional view. FIG. 4B is a sectional view taken in the direction of arrows A-A in FIG. 4A. FIG. 4C is a schematic process sectional view subsequent to FIG. 4A. FIG. 4D is a sectional view taken in the direction of arrows A-A in FIG. 4C.

FIGS. 5A to 5D are schematic process sectional views subsequent to FIGS. 4A to 4D. More specifically, FIG. 5A is a schematic process sectional view subsequent to FIG. 4C. FIG. 5B is a sectional view taken in the direction of arrows A-A in FIG. 5A. FIG. 5C is a schematic process sectional view subsequent to FIG. 5A. FIG. 5D is a sectional view taken in the direction of arrows A-A in FIG. 5C.

FIGS. 6A to 6D are schematic process sectional views subsequent to FIGS. 5A to 5D. More specifically, FIG. 6A is a schematic process sectional view subsequent to FIG. 5C.

FIG. 6B is a sectional view taken in the direction of arrows A-A in FIG. 6A. FIG. 6C is a schematic process sectional view subsequent to FIG. 6A. FIG. 6D is a sectional view taken in the direction of arrows A-A in FIG. 6C.

Figure 7A:
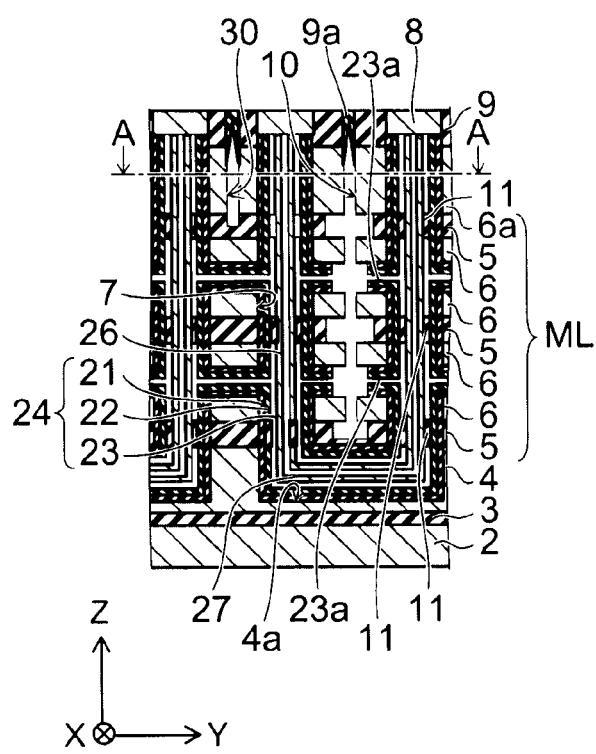
FIGS. 7A and 7B are schematic process sectional views subsequent to FIGS. 6A to 6D.
Figure 7B:
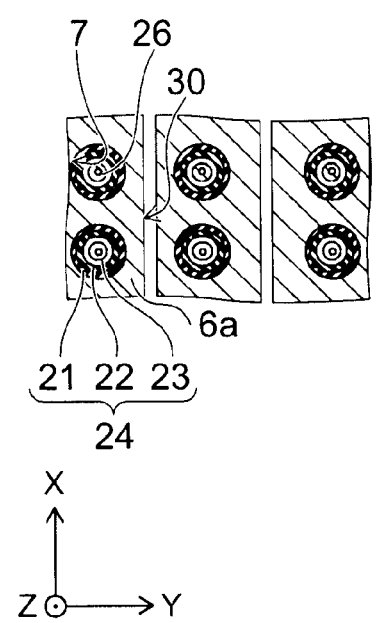

FIGS. 7A and 7B are schematic process sectional views subsequent to FIGS. 6A to 6D. More specifically, FIG. 7A is a schematic process sectional view subsequent to FIG. 6C. FIG. 7B is a sectional view taken in the direction of arrows A-A in FIG. 7A.

First, peripheral circuits, not shown, are formed in a peripheral circuit region, not shown, on a substrate 2.

Next, as shown in FIG. 4A, an insulating layer 3 and a back gate electrode 4 are formed in a memory region on the substrate 2. The insulating layer 3 can be formed from e.g. a silicon oxide film having a thickness of approximately 25 nm. The back gate electrode 4 can be formed from e.g. a boron-doped polycrystalline silicon film having a thickness of approximately 100 nm. In this case, the insulating layer 3 and the back gate electrode 4 can be formed by using known methods such as the film formation method, lithography method, and reactive ion etching method.

Then, by using the known lithography method and reactive ion etching method, a recess 4a for connecting adjacent semiconductor pillars 26 is formed in the back gate electrode 4. Then, amorphous silicon is embedded in the recess 4a.

Subsequently, on the entire surface above the back gate electrode 4, a silicon oxide film 105 constituting an interelectrode insulating layer 5 is stacked approximately 30 nm, a boron-doped amorphous silicon film 106 constituting a gate electrode 6 is stacked approximately 40 nm, and a silicon nitride film 107 constituting a sacrificial film is stacked approximately 30 nm.

That is, a plurality of boron-doped amorphous silicon films 106 constituting gate electrodes 6, a plurality of silicon oxide films 105 constituting interelectrode insulating layers 5, and a plurality of silicon nitride films 107 constituting sacrificial films are stacked to form a stacked body ML.

In this case, these films can be formed by plasma CVD (plasma-enhanced chemical vapor deposition). The number of stacked boron-doped amorphous silicon films 106 constituting gate electrodes 6 is five, with the uppermost layer constituting a select gate electrode 6a. However, the number of stacked layers is not limited thereto, but can be appropriately modified.

Next, as shown in FIG. 4C, a carbon film, not shown, is formed on the entire surface by using the CVD method. Then, an isolation trench 10 extending in the stacking direction of the stacked body ML is formed by using the known lithography method and reactive ion etching method. The isolation trench 10 constitutes a trench for isolating the gate electrodes 6 adjacent in the Y direction. Then, silicon oxide is embedded in the isolation trench 10.

Next, as shown in FIG. 5A, a carbon film, not shown, is formed on the entire surface by using the CVD method. Then, a plurality of through holes 7 extending in the stacking direction of the stacked body ML are formed by using the known lithography method and reactive ion etching method. The through hole 7 is formed so as to communicate with the recess 4a. Then, by the wet etching method using ammonia/hydrogen peroxide aqueous solution, the amorphous silicon embedded in the recess 4a is selectively removed. Subsequently, the carbon film is removed to form a U-shaped through hole serving as a template for memory cells 24 having the MONOS structure. Then, the silicon nitride films 107 as sacrificial films are selectively removed via the through hole 7. Thus, inter-electrode insulating layers 5, gate electrodes 6, a select gate electrode 6a, and an insulating film 9 are formed.

Next, as shown in FIG. 5C, inside the through hole 7 and the recess 4a, an alumina film 109 constituting a block insulating layer 21 is stacked approximately 15 nm, a silicon nitride film 110 constituting a charge trap layer 22 is stacked approximately 10 nm, and a sacrificial film 111 (corresponding to an example of the second sacrificial film) for forming a void 23 is stacked approximately 4 nm. In this case, the sacrificial film 111 can be a silicon oxide film, and is formed in a circular cylindrical shape having an inner diameter of approximately 10 nm. These films can be formed by using the ALD (atomic layer deposition) method and LPCVD (low pressure chemical vapor deposition) method. Thus, a stacked film constituting memory cells 24 having the MONOS structure is formed.

Furthermore, boron-doped polycrystalline silicon is embedded inside the sacrificial film 111 (the circular cylindrical hole) to form a semiconductor pillar 26 and a connecting beam 27.

That is, sequentially from the inner wall of the through hole 7, an alumina film 109 constituting a block insulating layer 21, a silicon nitride film 110 constituting a charge trap layer 22, a sacrificial film 111, and a semiconductor pillar 26 are formed.

This is performed so that in the space formed by removing the silicon nitride films 107 as sacrificial films, the sacrificial film 111 is embedded, but boron-doped polycrystalline silicon constituting a semiconductor pillar 26 is not embedded.

Furthermore, boron-doped polycrystalline silicon can be embedded so as to form a hollow semiconductor pillar 26 (e.g., a circular cylindrical semiconductor pillar 26).

Subsequently, a source/drain region portion 8 is formed. First, the alumina film 109, the silicon nitride film 110, and the sacrificial film 111 are set back by using the reactive ion etching method. Then, silicon oxide is embedded by using the ALD method. Subsequently, the embedded silicon oxide and boron-doped polycrystalline silicon are set back by using the reactive ion etching method. Then, polycrystalline silicon is embedded in the set-back portion. Subsequently, by using the known lithography method and ion implantation method, the embedded polycrystalline silicon is ion-implanted with arsenic to form a source/drain region portion 8.

In this embodiment, the MONOS film is embedded in the through hole 7. Hence, the cross-sectional dimension of the semiconductor pillar 26 can be reduced. This enables memory cell arrangement with higher bit density. Furthermore, the curvature radius of the void 23 functioning as a tunnel insulating layer can be reduced to enhance electric field concentration. Thus, a memory cell 24 with superior writing characteristics and erasing characteristics can be realized.

Furthermore, by forming a hollow semiconductor pillar 26, the thickness of the semiconductor pillar 26 controlled by the gate electrode 6 is made equal between the memory cells 24 stacked in the Z direction. This can suppress variation in the threshold voltage (Vth).

Next, as shown in FIG. 6A, the known lithography method, reactive ion etching method, and wet etching method are combined to remove the silicon oxide in the isolation trench 10, and to remove the end portion of the alumina film 109 and the silicon nitride film 110 exposed in the isolation trench 10. Thus, an opening connected to the sacrificial film 111 can be formed.

Next, as shown in FIG. 6C, by the wet etching method using hydrofluoric acid, the sacrificial film 111 is selectively removed via the isolation trench 10 to form a void 23 functioning as a tunnel insulating layer. At this time, the etching amount is controlled by performing duration control, for instance. Thus, part of the sacrificial film 111 is left so that a support portion 11 for keeping the distance (the width dimension of the void 23) between the charge trap layer 22 and the semiconductor pillar 26 is formed at a prescribed position. For instance, as shown in FIG. 6C, by removing part of the sacrificial film 111, a support portion 11 for keeping the distance between the charge trap layer 22 and the semiconductor pillar 26 can be formed at each position where the inter-electrode insulating layer 5 is provided in the stacking direction. Thus, the upper end or lower end of each of the stacked memory cells 24 can be supported by the support portion 11.

Thus, the support portion 11, the block insulating layer 21, the charge trap layer 22, and the void 23 can be formed.

Here, in the U-shaped channel structure, if the tunnel insulating film is simply replaced by a void 23, the U-shaped channel is held only in the upper portion. Thus, by the Coulomb force due to charge trapped during manufacturing, for instance, the U-shaped channel easily moves. This makes it difficult to keep the width dimension of the void 23 constant. If the width dimension of the void 23 is varied, or if the charge trap layer 22 and the semiconductor pillar 26 are brought into contact with each other, the reliability is degraded. Furthermore, this will become conspicuous with the progress of scaling.

In this embodiment, a support portion 11 is provided at a prescribed position of the void 23. Hence, the width dimension of the void 23 can be kept constant. Thus, the tunnel current characteristics can be kept constant.

Next, as shown in FIG. 7B, a trench 30 for dividing the select gate electrode 6a is formed by using the known lithography method and reactive ion etching method.

Then, by using the plasma CVD method, a silicon oxide film is formed on the entire surface of the insulating film 9 to close the opening portion of the isolation trench 10 and the trench 30. Here, the gas used in the plasma CVD method can be e.g. $SiH_4$ and $N_2O$.

By using the plasma CVD method, the space between the gate electrodes 6 adjacent in the Y direction is not completely filled, but a void is formed. This can suppress the parasitic capacitance between the gate electrodes 6.

As described above, the semiconductor memory device 1 can be manufactured.

The film configuration, the film formation method, the configuration of the MONOS film, the processing method and the like are not limited to those illustrated. Polycrystalline silicon, single crystal silicon, or semiconductors containing heterogeneous elements such as germanium crystallized by methods other than those illustrated, such as the laser annealing method or Ni catalyst method, can also be used to form the semiconductor pillar 26. The block insulating layer 21 in the MONOS film is not limited to an alumina film, but can also be made of a silicon oxide film, ONO film, a metal oxide film such as $Al_2O_3$, $HfO_2$, $La_2O_3$, $Pr_2O_3$, $Y_2O_3$, and $ZrO_2$, or a combination of a plurality of these metal oxide films. The gate electrode 6 is not limited to being simply made of a boron-doped polycrystalline silicon film. Alternatively, before embedding the sacrificial film 111, the boron-doped polycrystalline silicon film can also be silicidized with e.g. cobalt, titanium, or nickel by the CVD method, or replaced by tungsten using $WF_6$ to form a tungsten electrode. The number of stacked gate electrodes 6 is not limited to those illustrated. For instance, it is also possible to provide more layers (e.g., ten or more layers) than those illustrated. Furthermore, the film configuration, the film formation method, the configuration of the MONOS film, the processing method and the like can also be based on arbitrary combinations.

Fifth Embodiment

Next, a method for manufacturing a semiconductor memory device according to a fifth embodiment is illustrated.

The method for manufacturing a semiconductor memory device illustrated below illustrates a method for manufacturing the semiconductor memory device 1a described above.

In the method for manufacturing a semiconductor memory device according to this embodiment illustrated below, silicon oxide films constituting inter-electrode insulating layers 5 and silicon nitride films as sacrificial films are alternately stacked to form stacked memory cells. By previously embedding a silicon nitride film as a sacrificial film in the portion constituting a select gate electrode 6b, a select gate electrode 6b having an arbitrary gate length is formed.

Figure 8A:
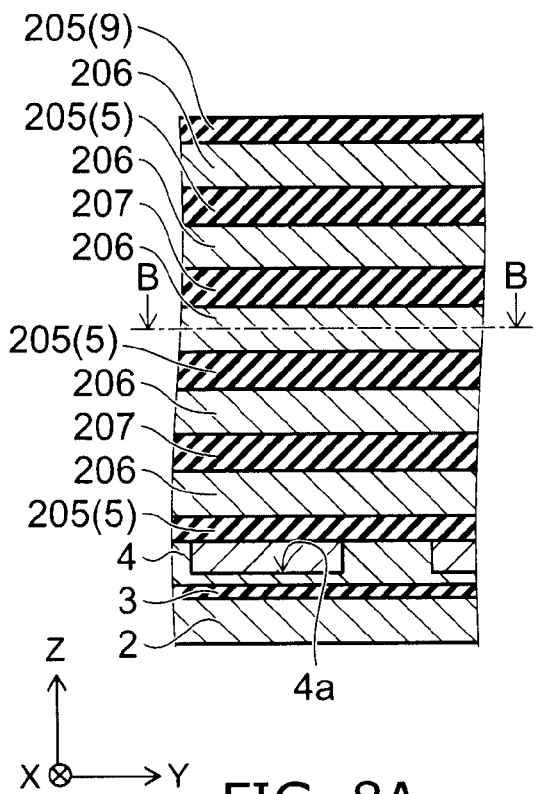
FIGS. 8A to 8D are schematic process sectional views illustrating the method for manufacturing a semiconductor memory device according to the fifth embodiment.
Figure 8B:
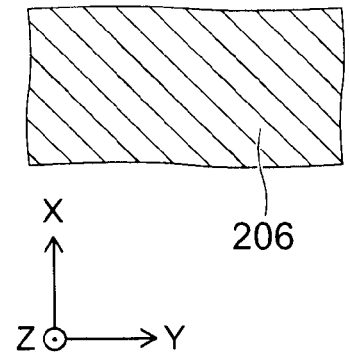
Figure 8C:
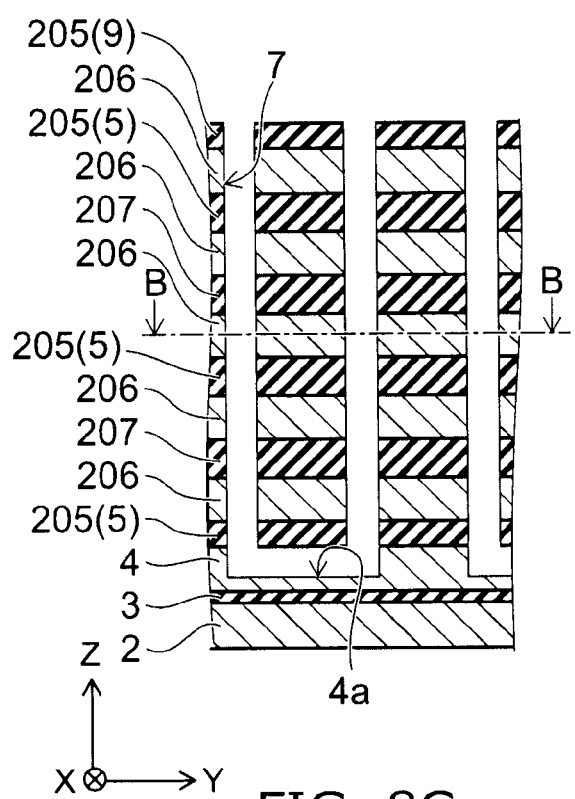
Figure 8D:
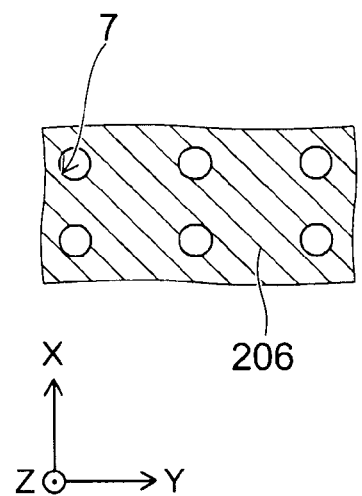

FIGS. 8A to 8D are schematic process sectional views illustrating the method for manufacturing a semiconductor memory device according to the fifth embodiment. More specifically, FIG. 8A is a schematic process sectional view. FIG. 8B is a sectional view taken in the direction of arrows B-B in FIG. 8A. FIG. 8C is a schematic process sectional view subsequent to FIG. 8A. FIG. 8D is a sectional view taken in the direction of arrows B-B in FIG. 8C.

FIGS. 9A to 9D are schematic process sectional views subsequent to FIGS. 8A to 8D. More specifically, FIG. 9A is a schematic process sectional view subsequent to FIG. 8C. FIG. 9B is a sectional view taken in the direction of arrows B-B in FIG. 9A. FIG. 9C is a schematic process sectional view subsequent to FIG. 9A. FIG. 9D is a sectional view taken in the direction of arrows B-B in FIG. 9C.

Figure 10A:
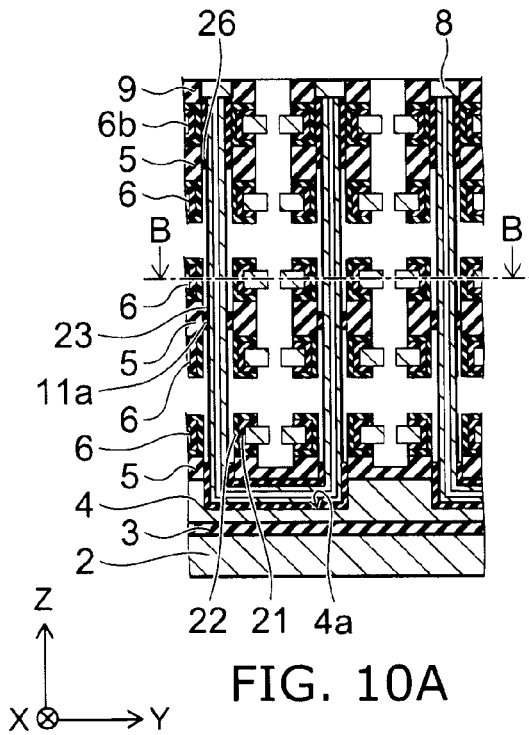
FIGS. 10A to 10D are schematic process sectional views subsequent to FIGS. 9A to 9D.
Figure 10B:
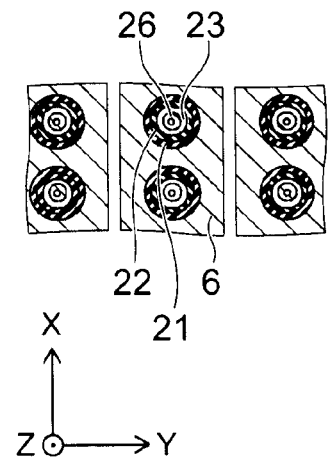
Figure 10C:
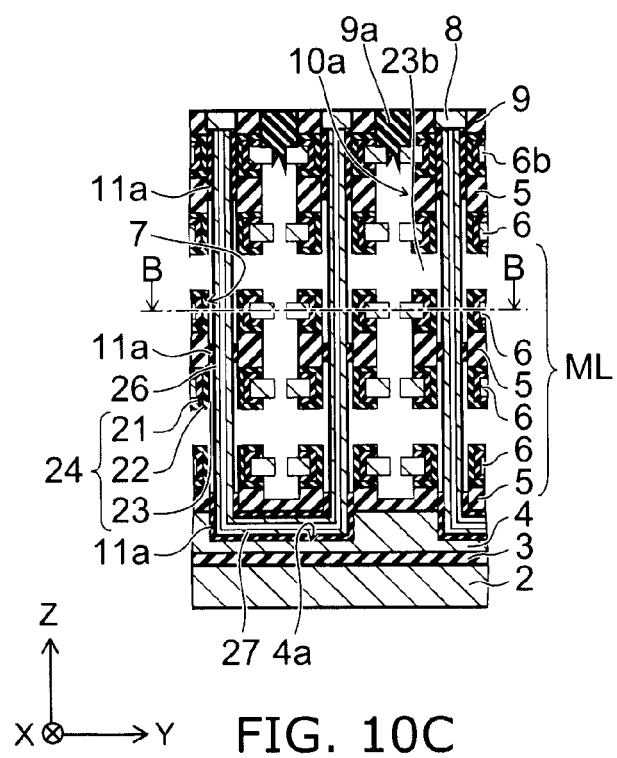
Figure 10D:
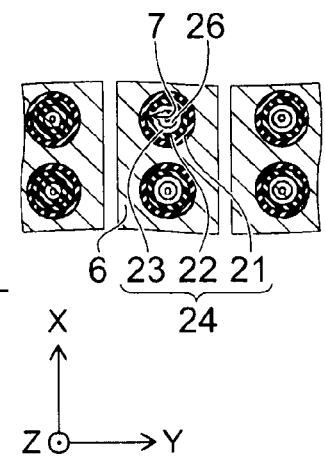

FIGS. 10A to 10D are schematic process sectional views subsequent to FIGS. 9A to 9D. More specifically, FIG. 10A is a schematic process sectional view subsequent to FIG. 9C. FIG. 10B is a sectional view taken in the direction of arrows B-B in FIG. 10A. FIG. 10C is a schematic process sectional view subsequent to FIG. 10A. FIG. 10D is a sectional view taken in the direction of arrows B-B in FIG. 10C.

First, peripheral circuits are formed in a peripheral circuit region, not shown, on a substrate 2.

Next, as shown in FIG. 8A, an insulating layer 3 and a back gate electrode 4 are formed in a memory region on the substrate 2. The insulating layer 3 can be formed from e.g. a silicon oxide film having a thickness of approximately 20 nm. The back gate electrode 4 can be formed from e.g. a phosphorus-doped polycrystalline silicon film having a thickness of approximately 100 nm. In this case, the insulating layer 3 and the back gate electrode 4 can be formed by using known methods such as the film formation method, lithography method, and reactive ion etching method.

Then, by using the known lithography method and reactive ion etching method, a recess 4a for connecting adjacent semiconductor pillars 26 is formed in the back gate electrode 4. Then, silicon germanium is filled in the recess 4a.

Subsequently, on the entire surface above the back gate electrode 4, a silicon oxide film 205 constituting an inter-electrode insulating layer 5 is stacked approximately 30 nm, a silicon nitride film constituting a sacrificial film 206 (corresponding to an example of the third sacrificial film) is stacked approximately 50 nm, and an amorphous silicon film constituting a sacrificial film 207 (corresponding to an example of the fourth sacrificial film) is stacked approximately 30 nm. That is, a plurality of silicon oxide films 205 constituting inter-electrode insulating layers 5, a plurality of sacrificial films 206, and a plurality of sacrificial films 207 are stacked to form a stacked body. In this case, the number of sacrificial films 206 formed is five. Between the sacrificial films 206, a silicon oxide film 205 or a sacrificial film 207 is formed. The silicon oxide film 205 and the sacrificial film 207 are alternately formed. These films can be formed by the plasma CVD (plasma-enhanced chemical vapor deposition) method.

Next, as shown in FIG. 8C, a carbon film, not shown, is formed on the entire surface by using the CVD method. Then, a plurality of through holes 7 extending in the stacking direction of the stacked body are formed by using the known lithography method and reactive ion etching method. The through hole 7 is formed so as to connect with the recess 4a. Subsequently, by the dry etching method using chlorine gas, the silicon germanium embedded in the recess 4a is selectively removed. Then, the carbon film is removed to form a U-shaped through hole serving as a template for memory cells 24 having the MONOS structure.

Next, as shown in FIG. 9A, by using the ALD method and LPCVD method, on the inner surface of the U-shaped through hole, a sacrificial film 208 (corresponding to an example of the fifth sacrificial film) of silicon oxide for forming a void 23 is stacked approximately 5 nm, and a phosphorus-doped polycrystalline silicon film 209 constituting a semiconductor pillar 26 is stacked approximately 8 nm. That is, sequentially from the inner wall of the through hole, a sacrificial film 208 and a semiconductor pillar 26 are formed. Furthermore, a silicon oxide film 210 is stacked on the inner surface of the phosphorus-doped polycrystalline silicon film 209. At this time, the silicon oxide film 210 is embedded so that the portion formed from the silicon oxide film 210 is shaped like a circular cylinder.

Subsequently, the end portion of the silicon oxide film 210 and the phosphorus-doped polycrystalline silicon film 209 is set back by using the reactive ion etching method. A polycrystalline silicon film 211 is embedded in the set-back portion. Then, by using the known lithography method and ion implantation method, the embedded polycrystalline silicon film 211 is ion-implanted with arsenic to form a source/drain region portion 8.

Subsequently, a carbon film, not shown, is formed by using the CVD method on the entire surface of the uppermost silicon oxide film 205. Then, an isolation trench 10a extending in the stacking direction of the stacked body is formed by using the known lithography method and reactive ion etching method.

Next, as shown in FIG. 9C, by wet etching with hot phosphoric acid, the sacrificial film 206 is selectively removed via the isolation trench 10a. Then, inside the isolation trench 10a, a silicon nitride film 212 constituting a charge trap layer 22 is stacked approximately 5 nm, and a hafnia film 213 constituting a block insulating layer 21 is stacked approximately 15 nm. Furthermore, a tantalum nitride/tungsten stacked film 214 constituting a gate electrode 6 is stacked by using the CVD method. That is, sequentially from the inner wall of the isolation trench 10a, a silicon nitride film 212 constituting a charge trap layer 22, a hafnia film 213 constituting a block insulating layer 21, and a tantalum nitride/tungsten stacked film 214 constituting a gate electrode 6 are formed. Subsequently, by etch back with $NF_3$ gas, an isolation trench 220 for dividing the tantalum nitride/tungsten stacked film 214 (gate electrode 6) for each memory cell is formed.

Thus, inter-electrode insulating layers 5, gate electrodes 6, a select gate electrode 6a, an insulating film 9, a block insulating layer 21, and a charge trap layer 22 are formed.

Next, as shown in FIG. 10A, by using the wet etching method, the hafnia film 213 and the silicon nitride film 212 are etched back via the isolation trench 220 to expose the end surface of the sacrificial film 207. Subsequently, by using the alkaline wet etching method, the sacrificial film 207 is selectively removed via the isolation trench. Then, by the wet etching method using hydrofluoric acid, the sacrificial film 208 is selectively removed via the isolation trench. At this time, by the selective removal of the sacrificial film 208, a void 23 functioning as a tunnel insulating layer is formed. Furthermore, by removing part of the sacrificial film 208, a support portion 11a for keeping the distance between the silicon nitride film 212 constituting a charge trap layer 22 and the semiconductor pillar is formed at each position where the inter-electrode insulating layer 5 is provided in the stacking direction. In this case, the etching amount is controlled by performing duration control, for instance. Thus, part of the sacrificial film 208 can be left so that a support portion 11a for keeping the distance (the width dimension of the void 23) between the charge trap layer 22 and the semiconductor pillar 26 is formed at a prescribed position. Here, the silicon oxide film (sacrificial film 208) formed by using the ALD method has five or more times higher wet etching rate than the silicon oxide film (e.g., silicon oxide film 205) formed by using the plasma CVD method. This facilitates selective etching.

Next, as shown in FIG. 10C, by using the plasma CVD method, a silicon oxide film is formed on the entire surface of the insulating film 9 to close the opening portion of the isolation trench 10a with an insulating film 9a. Here, the silicon oxide film can be formed from e.g. TEOS (tetraethoxysilane) and oxygen gas.

By using the plasma CVD method, the space between the gate electrodes 6 adjacent in the Y direction is not completely filled, but a void is formed. This can suppress the parasitic capacitance between the gate electrodes 6.

As described above, the semiconductor memory device 1a can be manufactured.

Also in this embodiment, similarly to the foregoing, the void 23 functioning as a tunnel insulating layer and the block insulating layer 21 are different in curvature radius. Electric field concentration can be enhanced by the void 23 located inside the circular cylindrical MONOS structure and having a smaller curvature radius. Thus, the writing characteristics and erasing characteristics can be significantly improved relative to the planar MONOS structure. Furthermore, this embodiment can also be made suitable for MLC (multi-level cell) operation. The void 23 functioning as a tunnel insulating layer has a dielectric constant as low as a relative dielectric constant of 1 (air gap). Hence, by concentrating the electric field on the void 23, the leakage current of the tunnel insulating layer such as leakage current during data retention can be suppressed.

The method for manufacturing a semiconductor memory device according to this embodiment can easily manufacture a semiconductor memory device 1a having such configuration. Hence, this embodiment can provide a semiconductor memory device having high bit density.

Furthermore, a support portion 11a is provided at a prescribed position of the void 23. Hence, the width dimension of the void 23 can be easily kept constant. Thus, the tunnel current characteristics can be kept constant.

The film configuration, the film formation method, the configuration of the MONOS film, the processing method and the like are not limited to those illustrated. Polycrystalline silicon, single crystal silicon, or semiconductors containing heterogeneous elements such as germanium crystallized by methods other than those illustrated, such as the laser annealing method or Ni catalyst method, can also be used to form the semiconductor pillar 26. The block insulating layer 21 in the MONOS film is not limited to an alumina film, but can also be made of a silicon oxide film, ONO film, a metal oxide film such as $Al_2O_3$, $HfO_2$, $La_2O_3$, $Pr_2O_3$, $Y_2O_3$, and $ZrO_2$, or a combination of a plurality of these metal oxide films. The gate electrode 6 can also be made of TiN, polycrystalline silicon, or e.g. WSi, CoSi, NiSi, PrSi, NiPtSi, PtSi, Pt, Ru, or $RuO_2$ formed by silicidizing a polycrystalline silicon film.

Thus, the method for manufacturing a semiconductor memory device according to this embodiment has an additional advantage that various metal electrode materials can be used.

The number of stacked gate electrodes 6 is not limited to those illustrated. For instance, the gate electrodes 6 can also be stacked in ten or more layers.

The method for manufacturing a semiconductor memory device according to this embodiment can achieve higher bit density by a smaller number of stacked layers, i.e., by a three-dimensional structure with lower profile. Hence, this embodiment can provide a semiconductor memory device having higher bit density without significant burden on integration. Furthermore, the method for manufacturing a semiconductor memory device according to this embodiment can continuously increase the packing density of semiconductor memory devices in the future. This makes it possible to manufacture a semiconductor memory device applicable to various application fields.

Sixth Embodiment

Next, a method for manufacturing a semiconductor memory device according to a sixth embodiment is illustrated.

The method for manufacturing a semiconductor memory device illustrated below illustrates a method for manufacturing the semiconductor memory device 1b described above.

In the methods for manufacturing a semiconductor memory device described above, the support portion 11, 11a for supporting the semiconductor pillar, i.e., the support portion 11, 11a for keeping the width dimension of the void constant, is alternately provided on the upper end side and the lower end side of each memory cell. In contrast, in the method for manufacturing a semiconductor memory device according to this embodiment, the support portion 11b is provided on one of the upper end side and the lower end side of each memory cell.

FIGS. 11A to 11D are schematic process sectional views illustrating the method for manufacturing a semiconductor memory device according to the sixth embodiment. More specifically, FIG. 11A is a schematic process sectional view. FIG. 11B is a sectional view taken in the direction of arrows C-C in FIG. 11A. FIG. 11C is a schematic process sectional view subsequent to FIG. 11A. FIG. 11D is a sectional view taken in the direction of arrows C-C in FIG. 11C.

FIGS. 12A to 12D are schematic process sectional views subsequent to FIGS. 11A to 11D. More specifically, FIG. 12A is a schematic process sectional view subsequent to FIG. 11C. FIG. 12B is a sectional view taken in the direction of arrows C-C in FIG. 12A. FIG. 12C is a schematic process sectional view subsequent to FIG. 12A. FIG. 12D is a sectional view taken in the direction of arrows C-C in FIG. 12C.

FIGS. 13A to 13D are schematic process sectional views subsequent to FIGS. 12A to 12D. More specifically, FIG. 13A is a schematic process sectional view subsequent to FIG. 12C. FIG. 13B is a sectional view taken in the direction of arrows C-C in FIG. 13A. FIG. 13C is a schematic process sectional view subsequent to FIG. 13A. FIG. 13D is a sectional view taken in the direction of arrows C-C in FIG. 13C.

First, peripheral circuits are formed in a peripheral circuit region, not shown, on a substrate 2.

Next, as shown in FIG. 11A, an insulating layer 3 and a back gate electrode 4 are formed in a memory region on the substrate 2. The insulating layer 3 can be formed from e.g. a silicon oxide film having a thickness of approximately 18 nm. The back gate electrode 4 can be formed from e.g. a boron-doped polycrystalline silicon film having a thickness of approximately 150 nm. In this case, the insulating layer 3 and the back gate electrode 4 can be formed by using known methods such as the film formation method, lithography method, and reactive ion etching method.

Then, by using the known lithography method and reactive ion etching method, a recess 4a for connecting adjacent semiconductor pillars 26a is formed in the back gate electrode 4. Then, amorphous silicon is embedded in the recess 4a.

Subsequently, by using the sputtering method, on the entire surface above the back gate electrode 4, a silicon oxide film 305 constituting an inter-electrode insulating layer 15 is stacked approximately 50 nm, a titanium film 306 (corresponding to an example of the seventh sacrificial film) constituting a sacrificial film is stacked approximately 50 nm, and a titanium nitride film 307 (corresponding to an example of the sixth sacrificial film) constituting a sacrificial film is stacked approximately 20 nm. Furthermore, by using the plasma CVD method, a silicon oxide film 308 constituting an inter-electrode insulating layer 15 is stacked approximately 30 nm. Then, a total of four sets of the titanium film 306, the titanium nitride film 307, and the silicon oxide film 308 are stacked. Furthermore, a boron-doped amorphous silicon film 309 constituting a select gate electrode 6c is stacked approximately 100 nm, and a silicon oxide film 310 constituting an insulating film 9 is stacked approximately 50 nm. That is, a plurality of silicon oxide films 308 constituting inter-electrode insulating layers 15, a plurality of titanium films 306 constituting sacrificial films, a plurality of titanium nitride films 307 constituting sacrificial films and the like are stacked to form a stacked body.

Next, as shown in FIG. 11C, a carbon film, not shown, is formed on the entire surface by using the CVD method. Then, a plurality of through holes 7 extending in the stacking direction of the stacked body are formed by using the known lithography method and reactive ion etching method. The through hole 7 is formed so as to communicate with the recess 4a. Next, by using the alkaline wet etching method, the amorphous silicon embedded in the recess 4a is selectively removed. Then, the carbon film is removed to form a U-shaped through hole serving as a template for memory cells 24 having the MONOS structure.

Next, by using the plasma nitridation method, the titanium film 306 exposed at the cross section of the through hole 7 is nitridized to form a titanium nitride film 311 (corresponding to an example of the eighth sacrificial film) having a thickness of approximately 5 nm. That is, a titanium nitride film 311 is formed on the titanium film 306 via the through hole 7. Subsequently, a phosphorus-doped polycrystalline silicon film 312 constituting a semiconductor pillar 26a and a connecting beam 27a is embedded approximately 15 nm. That is, a semiconductor pillar 26a is formed inside the through hole 7. Next, a silicon oxide film 313 is formed to fill the U-shaped through hole 7. Subsequently, the end portion of the silicon oxide film 313 and the phosphorus-doped polycrystalline silicon film 312 is set back by using the reactive ion etching method, and a polycrystalline silicon film 314 is embedded. Next, by using the known lithography method and ion implantation method, the polycrystalline silicon film 314 is ion-implanted with arsenic to form a source/drain region portion 8.

Next, as shown in FIG. 12A, a carbon film, not shown, is formed on the entire surface by using the CVD method. Then, an isolation trench 10b extending in the stacking direction of the stacked body is formed by using the known lithography method and reactive ion etching method. The isolation trench 10b isolates the gate electrodes 6 adjacent in the Y direction. Subsequently, by the dry etching method using chlorine gas, the titanium film 306 is selectively removed via the isolation trench 10b, leaving only the titanium nitride film 307 and the titanium nitride film 311.

Next, as shown in FIG. 12C, by using the ALD method and LPCVD method, to form memory cells 24 having the MONOS structure, a silicon nitride film 315 constituting a charge trap layer 22 and an ONO film (a stacked film of silicon oxide film/silicon nitride film/silicon oxide film) 316 constituting a block insulating layer 21 are embedded. Furthermore, a boron-doped polycrystalline silicon film 317 constituting a gate electrode 6 is embedded. That is, sequentially from the inner wall of the isolation trench 10b, a silicon nitride film 315 constituting a charge trap layer 22, an ONO film 316 constituting a block insulating layer 21, and a boron-doped polycrystalline silicon film 317 constituting a gate electrode 6 are formed.

In this embodiment, the MONOS structure is embedded in the memory plug hole. Hence, the cross-sectional dimension of the semiconductor pillar 26a can be reduced. This enables memory cell arrangement with higher bit density. Furthermore, the curvature radius of the void 23 functioning as a tunnel insulating layer can be reduced to enhance electric field concentration. Thus, a memory cell 24 with superior writing characteristics and erasing characteristics can be realized.

Next, by etching with $NF_3$, the boron-doped polycrystalline silicon film 317 is etched back. Thus, the stacked boron-doped polycrystalline silicon film 317 is divided for each memory cell.

Next, as shown in FIG. 13A, by using the plasma oxidation method, the ONO film 316, the silicon nitride film 315, and the boron-doped polycrystalline silicon film 317 are locally oxidized to form a silicon oxide film, not shown. Next, by the wet etching method using hydrofluoric acid, the locally formed silicon oxide film is removed to expose the titanium nitride film 307.

Next, as shown in FIG. 13C, by using the alkaline wet etching method, the titanium nitride film 307 and the titanium nitride film 311 are selectively removed via the isolation trench 10b to form a void 23 functioning as a tunnel insulating layer. At this time, a support portion 11b for keeping the width dimension of the void 23 constant is formed, one for each of the stacked memory cells 24. That is, the silicon oxide film 305 and the silicon oxide film 308 constituting an inter-electrode insulating layer 15 are configured to function also as a support portion 11b. Thus, when the titanium nitride film 311 is removed, the distance between the silicon nitride film 315 constituting a charge trap layer 22 and the semiconductor pillar 26a is kept by the inter-electrode insulating layer 15.

Next, by using the plasma CVD method, a silicon oxide film 318 constituting an insulating film 19 is formed. Thus, the opening portion of the isolation trench 10b is occluded, and a void 23c (air gap) is formed between the boron-doped polycrystalline silicon films 317 (gate electrodes 6).

Here, in the U-shaped channel structure, if the tunnel insulating film is simply replaced by a void 23, the U-shaped channel is held only in the upper portion. Thus, by the Coulomb force due to charge trapped during manufacturing, for instance, the U-shaped channel easily moves. This makes it difficult to keep the width dimension of the void 23 constant. If the width dimension of the void 23 is varied, or if the charge trap layer 22 and the semiconductor pillar 26a are brought into contact with each other, the reliability is decreased. Furthermore, this may become conspicuous with the progress of scaling.

In this embodiment, an inter-electrode insulating layer 15 functioning also as a support portion 11b is provided at a prescribed position of the void 23. Hence, the width dimension of the void 23 can be kept constant. Thus, the tunnel current characteristics can be kept constant.

As described above, the semiconductor memory device 1b can be manufactured.

Also in this embodiment, similarly to the foregoing, the void 23 functioning as a tunnel insulating layer and the block insulating layer 21 are different in curvature radius. Electric field concentration can be enhanced by the void 23 located inside the circular cylindrical MONOS structure and having a smaller curvature radius. Thus, the writing characteristics and erasing characteristics can be significantly improved relative to the planar MONOS structure. Furthermore, this embodiment can also be made suitable for MLC operation. The void 23 functioning as a tunnel insulating layer has a dielectric constant as low as a relative dielectric constant of 1 (air gap). Hence, by concentrating the electric field on the void 23, the leakage current of the tunnel insulating layer such as leakage current during data retention can be suppressed.

The method for manufacturing a semiconductor memory device according to this embodiment can easily manufacture a semiconductor memory device 1b having such configuration. Hence, this embodiment can provide a semiconductor memory device having high bit density.

The film configuration, the film formation method, the configuration of the MONOS film, the processing method and the like are not limited to those illustrated. Polycrystalline silicon, single crystal silicon, or semiconductors containing heterogeneous elements such as germanium crystallized by methods other than those illustrated, such as the laser annealing method or Ni catalyst method, can also be used to form the semiconductor pillar 26a. The block insulating layer 21 in the MONOS film is not limited to an ONO film, but can also be made of a silicon oxide film, a metal oxide film such as $Al_2O_3$, $HfO_2$, $La_2O_3$, $Pr_2O_3$, $Y_2O_3$, and $ZrO_2$, or a combination of a plurality of these metal oxide films. The gate electrode 6 is not limited to being simply made of a boron-doped polycrystalline silicon film 317. Alternatively, the boron-doped polycrystalline silicon film 317 can also be silicidized with e.g. cobalt, titanium, or nickel by the CVD method, or replaced by tungsten using $WF_6$ to form a tungsten electrode. The number of stacked gate electrodes 6 is not limited to those illustrated. For instance, it is also possible to provide more layers (e.g., ten or more layers) than those illustrated.

The embodiments illustrated above can realize a semiconductor memory device capable of improving the reliability, and a method for manufacturing the same.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor memory device comprising:
   a stacked body including a plurality of stacked gate electrodes and inter-electrode insulating layers provided between the gate electrodes;
   a semiconductor pillar punching through the stacked body; and
   a plurality of memory cells provided in stacking direction, the memory cell including a charge trap layer provided between the semiconductor pillar and a respective gate electrode of the stacked gate electrodes via an air gap, and a block insulating layer provided between the charge trap layer and the respective gate electrode,
   each of the plurality of memory cells being provided with a support portion configured to keep air gap distance between the charge trap layer and the semiconductor pillar.

2. The device according to claim 1, wherein the support portion is further provided at an upper end or lower end of the semiconductor pillar.

3. The device according to claim 1, wherein arrangement pitch of the support portions has periodicity.

4. The device according to claim 1, wherein the support portion includes silicon oxide.

5. The device according to claim 1, wherein a void is formed between adjacent gate electrodes of the plurality of memory cells in a direction orthogonal to the stacking direction.

6. The device according to claim 1, wherein a void is formed between the gate electrodes with a prescribed spacing in the stacking direction.

7. The device according to claim 1, wherein the support portion is provided integrally with the inter-electrode insulating layer.

8. The device according to claim 1, wherein
   a plurality of the semiconductor pillars are provided, and
   lower ends of two adjacent ones of the semiconductor pillars are connected by a connecting beam.

9. The device according to claim 8, wherein upper end of one of the two semiconductor pillars connected by the connecting beam is connected to a source line, and upper end of the other is connected to a bit line.

* * * * *